United States Patent
Sams et al.

(10) Patent No.: US 12,295,088 B2
(45) Date of Patent: May 6, 2025

(54) HYBRID DROPLET GENERATOR FOR EXTREME ULTRAVIOLET LIGHT SOURCES IN LITHOGRAPHIC RADIATION SYSTEMS

(71) Applicant: ASML Netherlands B.V., Veldhoven (NL)

(72) Inventors: Benjamin Andrew Sams, San Diego, CA (US); Dietmar Uwe Herbert Trees, San Diego, CA (US); Theodorus Wilhelmus Driessen, San Diego, CA (US); Herman Harry Borggreve, Waalre (NL); Brandon Michael Johnson, Escondido, CA (US); Vikas Giridhar Telkar, Escondido, CA (US)

(73) Assignee: ASML Netherlands B.V., Veldhoven (NL)

( * ) Notice: Subject to any disclaimer, the term of this patent is extended or adjusted under 35 U.S.C. 154(b) by 203 days.

(21) Appl. No.: 17/922,056

(22) PCT Filed: Apr. 26, 2021

(86) PCT No.: PCT/EP2021/060798
§ 371 (c)(1),
(2) Date: Oct. 28, 2022

(87) PCT Pub. No.: WO2021/233645
PCT Pub. Date: Nov. 25, 2021

(65) Prior Publication Data
US 2023/0171869 A1    Jun. 1, 2023

Related U.S. Application Data

(60) Provisional application No. 63/029,090, filed on May 22, 2020.

(51) Int. Cl.
H05G 2/00   (2006.01)
B05B 1/02   (2006.01)
G03F 7/00   (2006.01)

(52) U.S. Cl.
CPC ............... H05G 2/006 (2013.01); B05B 1/02 (2013.01); G03F 7/70033 (2013.01); *H05G 2/008* (2013.01)

(58) Field of Classification Search
CPC .......... H05G 2/006; H05G 2/008; B05B 1/02; G03F 7/70033
See application file for complete search history.

(56) References Cited

U.S. PATENT DOCUMENTS 7,372,056 B2   5/2008   Bykanov et al.
7,405,416 B2   7/2008   Algots et al.
(Continued)

FOREIGN PATENT DOCUMENTS

WO   WO-2017102931 A1 *   6/2017   ......... G03F 7/70033
WO   WO-2017121573 A1 *   7/2017   ......... G03F 7/70033
WO   2019137846 A1   7/2019

OTHER PUBLICATIONS

European International Searching Authority, International Search Report and Written Opinion, counterpart PCT Application No. PCT/EP2021/060798, mailed Jul. 7, 2021, 12 pages.

*Primary Examiner* — Hung V Nguyen
(74) *Attorney, Agent, or Firm* — DiBerardino McGovern IP Group LLC

(57) ABSTRACT

A droplet generator nozzle (800, 820/830) includes a metal body (802, 822), a metal fitting (812, 823/833) arranged adjacent to the metal body, and a capillary (804, 824/834) comprising a first end and a second end. The first end of the capillary is disposed within the metal fitting, and the capillary is configured to eject initial droplets of a material from the second end of the capillary. The droplet generator nozzle (Continued)

further includes an electromechanical element (808 828/ 838) disposed within the metal body and coupled to the first end of the capillary and a fastener element (810) configured to clamp around a portion of the metal body and around the metal fitting. The electromechanical element is configured to apply a change that affects droplet generation from the capillary. The second end of the capillary protrudes out from an opening in the fastener element of the droplet generator nozzle. Droplet generator nozzle 830 of FIG. 8C represents the embodiment shown in FIG. 8B, in a cross section orthogonal to the cross section shown in FIG. 8B.

21 Claims, 12 Drawing Sheets

(56) References Cited

U.S. PATENT DOCUMENTS

| | | | |
|---|---|---|---|
| 7,872,245 | B2 | 1/2011 | Vaschenko et al. |
| 8,513,629 | B2 | 8/2013 | Rajyaguru et al. |
| 9,715,174 | B2* | 7/2017 | Dijksman ............... B05B 17/06 |
| 2009/0014668 | A1 | 1/2009 | Vaschenko |
| 2014/0151582 | A1 | 6/2014 | Rollinger et al. |
| 2017/0332467 | A1 | 11/2017 | Sanders et al. |
| 2018/0364580 | A1 | 12/2018 | Dijksman et al. |
| 2019/0137882 | A1 | 5/2019 | Lai et al. |
| 2020/0128657 | A1 | 4/2020 | Winkels et al. |
| 2022/0363596 | A1* | 11/2022 | Trees ................. G03F 7/70033 |

* cited by examiner

HYBRID DROPLET GENERATOR FOR EXTREME ULTRAVIOLET LIGHT SOURCES IN LITHOGRAPHIC RADIATION SYSTEMS

CROSS REFERENCE TO RELATED APPLICATIONS

This application claims priority to U.S. Application No. 63/029,090, filed May 22, 2020 and titled HYBRID DROPLET GENERATOR FOR EXTREME ULTRAVIOLET LIGHT SOURCES IN LITHOGRAPHIC RADIATION SYSTEMS, which is incorporated herein in its entirety by reference.

FIELD

The present application relates to methods, devices, and systems for a hybrid droplet generator for extreme ultraviolet ("EUV") radiation sources. EUV radiation may be used as exposure radiation in a lithographic process to fabricate semiconductor devices.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device such as a mask or a reticle, can be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning" direction) while synchronously scanning the target portions parallel to and along the scanning direction or parallel to and opposite the scanning direction. It is also possible to transfer the pattern from the patterning device to the substrate by imprinting the pattern onto the substrate.

Another lithographic system is an interferometric lithographic system where there is no patterning device, but rather a light beam is split into two beams, and the two beams are caused to interfere at a target portion of the substrate through the use of a reflection system. The interference causes lines to be formed at the target portion of the substrate.

A lithographic apparatus typically includes an illumination system that conditions radiation generated by a radiation source before the radiation is incident upon a patterning device. A patterned beam of EUV light can be used to produce extremely small features on a substrate. Extreme ultraviolet light (also sometimes referred to as soft x-rays) is generally defined as electromagnetic radiation having wavelengths in the range of about 5-100 nm. One particular wavelength of interest for photolithography occurs at 13.5 nm.

Methods to produce EUV light include, but are not necessarily limited to, converting a source material into a plasma state that has a chemical element with an emission line in the EUV range. These elements can include, but are not necessarily limited to, xenon, lithium and tin.

In one such method, often termed laser produced plasma ("LPP"), the desired plasma can be produced by irradiating a source material, for example, in the form of a droplet, stream or wire, with a laser beam. In another method, often termed discharge produced plasma ("DPP"), the required plasma can be generated by positioning source material having an appropriate emission line between a pair of electrodes and causing an electrical discharge to occur between the electrodes.

One technique for generating droplets involves melting a target material such as tin and then forcing it under high pressure through a relatively small diameter orifice to produce a stream of droplets having droplet velocities in the range of about 30 m/s to about 150 m/s. Under most conditions, in a process called Rayleigh breakup, naturally occurring instabilities, e.g. noise, in the stream exiting the orifice, will cause the stream to break up into droplets. These droplets may have varying velocities and may combine with each other to coalesce into larger droplets.

In some cases, devices used for droplet formation in EUV systems may demonstrate reduced stability and predictability of droplets as a result of vibrations and limited design features in such devices. Unstable droplet formation can impact accuracy of lithographic processes that depend on the EUV radiation.

SUMMARY

Accordingly, some aspects of the present disclosure provide methods, devices, and systems for a hybrid droplet generator for EUV light sources in lithographic radiation systems in order to improve droplet formation and accuracy in EUV lithographic apparatuses. In some aspects, the hybrid droplet generator includes a droplet generator nozzle that has an electromechanical element that is placed inside the metal fitting of the nozzle inlet side. By moving the electromechanical element upstream, such that the element does not directly enclose a capillary of the droplet generator nozzle, the capillary can have greater stability and a reduction in vibrations, which allows for an improvement of control in droplet generation.

In some embodiments, a droplet generator nozzle includes a metal body, a metal fitting arranged adjacent to the metal body, a capillary, an electromechanical element, and a fastener element. The capillary has a first end and a second end. The first end of the capillary is disposed within the metal fitting. The capillary is configured to eject initial droplets of a material from the second end of the capillary. The electromechanical element is disposed within the metal body and coupled to the first end of the capillary. The electromechanical element is configured to apply a change that affects droplet generation from the capillary. The fastener element is configured to clamp around a portion of the metal body and around the metal fitting. The second end of the capillary protrudes out from an opening in the fastener element.

In some embodiments, a lithographic apparatus includes an illumination system configured to illuminate a pattern of a patterning device and a projection system configured to project an image of the pattern on to a target portion of a substrate. The illumination system includes a droplet generator nozzle that includes a metal body, a metal fitting arranged adjacent to the metal body, a capillary, an electromechanical element, and a fastener element. The capillary has a first end and a second end. The first end of the capillary is disposed within the metal fitting. The capillary is configured to eject initial droplets of a material from the second end of the capillary The electromechanical element is disposed within the metal body and coupled to the first end of the capillary. The electromechanical element is configured to apply a change that affects droplet generation from the capillary. The fastener element is configured to clamp around a portion of the metal body and around the metal fitting. The second end of the capillary protrudes out from an opening in the fastener element. The illumination system is further configured to generate EUV radiation using the droplet generator nozzle.

In some embodiments, a method for generating droplets is disclosed. The method includes using a droplet generator nozzle, in which the droplet generator nozzle includes a metal body, a metal fitting arranged adjacent to the metal body, a capillary with a first end and a second end, the first end of the capillary disposed within the metal fitting, an electromechanical element disposed within the metal body and coupled to the first end of the capillary, and a fastener element configured to clamp around a portion of the metal body and around the metal fitting, with the second end of the capillary protruding out from an opening in the fastener element. The method further includes ejecting initial droplets of a material from the second end of the capillary and applying a change by the electromechanical element that affects droplet generation from the capillary.

Further features of various embodiments of the present disclosure are described in detail below with reference to the accompanying drawings. It is noted that the present disclosure is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

The accompanying drawings, which are incorporated herein and form part of the specification, illustrate the present disclosure and, together with the description, further serve to explain the principles of the present disclosure and to enable a person skilled in the relevant art(s) to make and use embodiments described herein.

Figure 1:
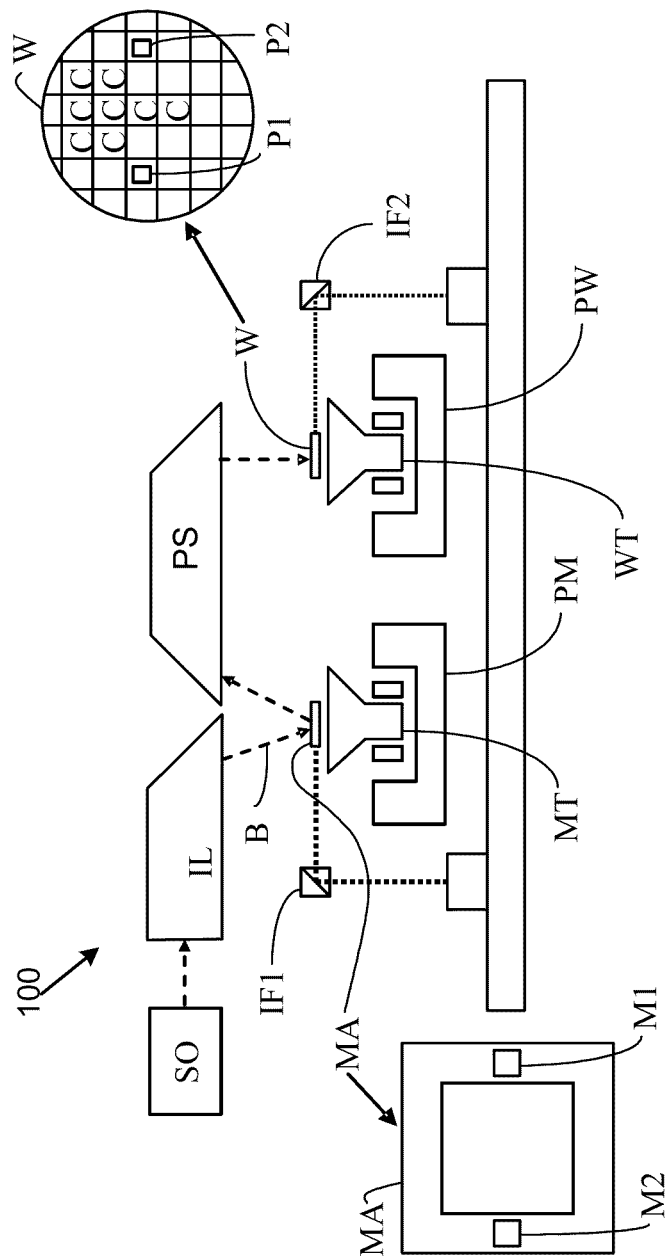
FIG. 1 shows a schematic of a reflective lithographic apparatus, according to some embodiments.

The features of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements. Additionally, generally, the left-most digit of a reference number identifies the drawing in which the reference number first appears. Unless otherwise indicated, the drawings provided throughout the disclosure should not necessarily be interpreted as to-scale drawings.

DETAILED DESCRIPTION

This specification discloses one or more embodiments that incorporate the features of the present disclosure. The disclosed embodiments are provided as examples. The scope of the present disclosure is not limited to the disclosed embodiments. Claimed features are defined by the claims appended hereto.

The embodiments described, and references in the specification to "one embodiment," "an embodiment," "an example embodiment," "an exemplary embodiment," etc., indicate that the embodiments described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Spatially relative terms, such as "beneath," "below," "lower," "above," "on," "upper" and the like, can be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus can be otherwise oriented (rotated 90 degrees or at other orientations) and the spatially relative descriptors used herein may likewise be interpreted accordingly.

The term "about" as used herein indicates the value of a given quantity that can vary based on a particular technology. Based on the particular technology, the term "about" can indicate a value of a given quantity that varies within, for example, 10-30% of the value (e.g., ±10%, ±20%, or ±30% of the value).

Embodiments of the disclosure can be implemented in hardware, firmware, software, or any combination thereof. Embodiments of the disclosure may also be implemented as instructions stored on a machine-readable medium, which can be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, and/or instructions can be described herein as performing certain actions. However, it should be appreciated that such descriptions are merely for convenience and that such actions in fact result from computing devices, processors, controllers, or other devices executing the firmware, software, routines, instructions, etc.

Before describing such embodiments in more detail, however, it is instructive to present an example environment in which embodiments of the present disclosure can be implemented.

Example Lithographic Systems

FIG. 1 shows a schematic illustration of a lithographic apparatus 100 in which embodiments of the present disclosure may be implemented. Lithographic apparatus 100 includes the following: an illumination system (illuminator) IL configured to condition a radiation beam B (for example, deep ultra violet or extreme ultra violet radiation); a support structure (for example, a mask table) MT configured to support a patterning device (for example, a mask, a reticle, or a dynamic patterning device) MA and connected to a first positioner PM configured to accurately position the patterning device MA; and, a substrate table (for example, a wafer table) WT configured to hold a substrate (for example, a resist coated wafer) W and connected to a second positioner PW configured to accurately position the substrate W. Lithographic apparatus 100 also has a projection system PS configured to project a pattern imparted to the radiation beam B by patterning device MA onto a target portion (for example, comprising one or more dies) C of the substrate W. In lithographic apparatus 100, the patterning device MA and the projection system PS are reflective.

The illumination system IL may include various types of optical components, such as refractive, reflective, catadioptric, magnetic, electromagnetic, electrostatic, or other types of optical components, or any combination thereof, for directing, shaping, or controlling the radiation beam B.

The support structure MT holds the patterning device MA in a manner that depends on the orientation of the patterning device MA with respect to a reference frame, the design of lithographic apparatus 100, and other conditions, such as whether or not the patterning device MA is held in a vacuum environment. The support structure MT may use mechanical, vacuum, electrostatic, or other clamping techniques to hold the patterning device MA. The support structure MT may be a frame or a table, for example, which may be fixed or movable, as required. By using sensors, the support structure MT may ensure that the patterning device MA is at a desired position, for example, with respect to the projection system PS.

The term "patterning device" MA should be broadly interpreted as referring to any device that may be used to impart a radiation beam B with a pattern in its cross-section, such as to create a pattern in the target portion C of the substrate W. The pattern imparted to the radiation beam B may correspond to a particular functional layer in a device being created in the target portion C to form an integrated circuit.

The patterning device MA may be reflective. Examples of patterning devices MA include reticles, masks, programmable mirror arrays, or programmable LCD panels. Masks are well known in lithography, and include mask types such as binary, alternating phase shift, or attenuated phase shift, as well as various hybrid mask types. An example of a programmable mirror array employs a matrix arrangement of small mirrors, each of which may be individually tilted so as to reflect an incoming radiation beam in different directions. The tilted mirrors impart a pattern in the radiation beam B, which is reflected by a matrix of small mirrors.

The term "projection system" PS may encompass any type of projection system, including refractive, reflective, catadioptric, magnetic, electromagnetic and electrostatic optical systems, or any combination thereof, as appropriate for the exposure radiation being used, or for other factors, such as the use of an immersion liquid on the substrate W or the use of a vacuum. A vacuum environment may be used for EUV or electron beam radiation since other gases may absorb too much radiation or electrons. A vacuum environment may therefore be provided to the whole beam path with the aid of a vacuum wall and vacuum pumps.

Lithographic apparatus 100 may be of a type having two (dual stage) or more substrate tables WT (and/or two or more mask tables). In such "multiple stage" machines, the additional substrate tables WT may be used in parallel, or preparatory steps may be carried out on one or more tables while one or more other substrate tables WT are being used for exposure. In some situations, the additional table may not be a substrate table WT.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

The illuminator IL receives a radiation beam from a radiation source SO. The source SO and the lithographic apparatus 100 may be separate physical entities, for example, when the source SO is an excimer laser. In such cases, the source SO is not considered to form part of the lithographic apparatus 100 and the radiation beam B passes from the source SO to the illuminator IL with the aid of a beam delivery system BD (not shown) including, for example, suitable directing mirrors and/or a beam expander. In other cases, the source SO may be an integral part of the lithographic apparatus 100, for example, when the source SO is a mercury lamp. The source SO and the illuminator IL, together with the beam delivery system BD, if required, may be referred to as a radiation system.

To not overcomplicate the drawing, the illuminator IL may include other components that are not shown. For example, the illuminator IL may include an adjuster for adjusting the angular intensity distribution of the radiation beam. Generally, at least the outer and/or inner radial extent (commonly referred to as "σ-outer" and "σ-inner," respectively) of the intensity distribution in a pupil plane of the illuminator may be adjusted. The illuminator IL may comprise an integrator and/or a condenser (not shown). The illuminator IL may be used to condition the radiation beam B to have a desired uniformity and intensity distribution in its cross section. The desired uniformity of radiation beam B can be maintained by using a uniformity compensator. Uniformity compensator comprises a plurality of protrusions (e.g., fingers) that may be adjusted in the path of radiation beam B to control the uniformity of radiation beam B. A sensor may be used to monitor the uniformity of radiation beam B.

The radiation beam B is incident on the patterning device (for example, mask) MA, which is held on the support structure (for example, mask table) MT, and is patterned by the patterning device MA. In lithographic apparatus 100, the radiation beam B is reflected from the patterning device (for example, mask) MA. After being reflected from the patterning device (for example, mask) MA, the radiation beam B passes through the projection system PS, which focuses the radiation beam B onto a target portion C of the substrate W. With the aid of the second positioner PW and position sensor IF2 (for example, an interferometric device, linear encoder, or capacitive sensor), the substrate table WT may be moved accurately (for example, so as to position different target portions C in the path of the radiation beam B). Similarly, the first positioner PM and another position sensor IF1 may be used to accurately position the patterning device (for example, mask) MA with respect to the path of the radiation beam B. Patterning device (for example, mask) MA and substrate W may be aligned using mask alignment marks M1, M2 and substrate alignment marks P1, P2.

The lithographic apparatus 100 may be used in at least one of the following modes:

1. In step mode, the support structure (for example, mask table) MT and the substrate table WT are kept essentially stationary, while an entire pattern imparted to the radiation beam B is projected onto a target portion C at one time (i.e., a single static exposure). The substrate table WT is then shifted in the X and/or Y direction so that a different target portion C may be exposed.

2. In scan mode, the support structure (for example, mask table) MT and the substrate table WT are scanned synchronously while a pattern imparted to the radiation beam B is projected onto a target portion C (i.e., a single dynamic exposure). The velocity and direction of the substrate table WT relative to the support structure (for example, mask table) MT may be determined by the (de-) magnification and image reversal characteristics of the projection system PS.

3. In another mode, the support structure (for example, mask table) MT is kept substantially stationary holding a programmable patterning device, and the substrate table WT is moved or scanned while a pattern imparted to the radiation beam B is projected onto a target portion C. A pulsed radiation source SO may be employed and the programmable patterning device is updated as required after each movement of the substrate table WT or in between successive radiation pulses during a scan. This mode of operation may be readily applied to maskless lithography that utilizes a programmable patterning device, such as a programmable mirror array.

Combinations and/or variations on the described modes of use or entirely different modes of use may also be employed.

In a further embodiment, lithographic apparatus 100 includes EUV radiation source configured to generate a beam of EUV radiation for EUV lithography. In general, the EUV radiation source is configured in a radiation system, and a corresponding illumination system is configured to condition the EUV radiation beam of the EUV source.

Figure 2A:
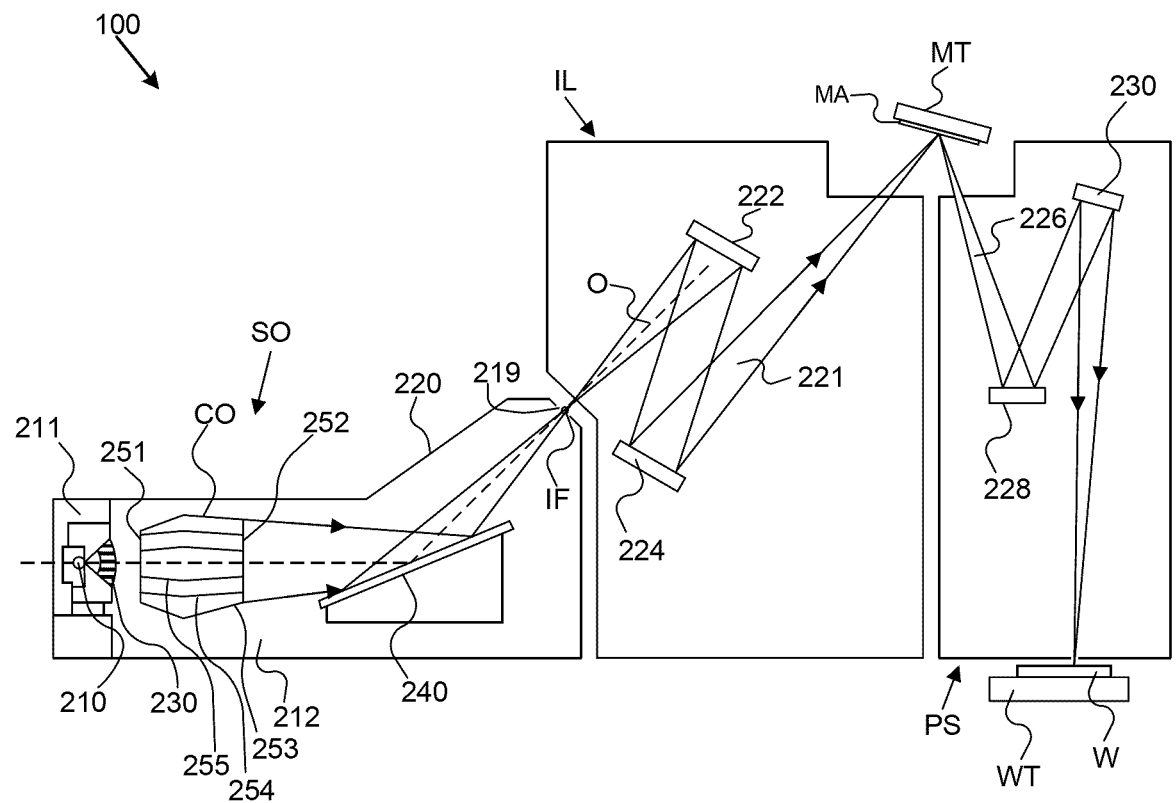
FIGS. 2A, 2B, and 3 show more detailed schematics of a reflective lithographic apparatus, according to some embodiments.

FIG. 2A shows the lithographic apparatus 100 (e.g., FIG. 1) in more detail, including the source collector apparatus SO, the illumination system IL, and the projection system PS, according to some embodiments. The source collector apparatus SO is constructed and arranged such that a vacuum environment may be maintained in an enclosing structure 220 of the source collector apparatus SO. An EUV radiation emitting plasma 210 may be formed by a discharge produced plasma source. EUV radiation may be produced by a gas or vapor, for example Xe gas, Li vapor, or Sn vapor in which the very hot plasma 210 is created to emit radiation in the EUV range of the electromagnetic spectrum. The very hot plasma 210 is created by, for example, an electrical discharge causing at least a partially ionized plasma. Partial pressures of, for example, 10 Pa of Xe, Li, Sn vapor, or any other suitable gas or vapor may be required for efficient generation of the radiation. In some embodiments, a plasma of excited tin (Sn) (e.g., excited via a laser) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap), which is positioned in or behind an opening in source chamber 211. The contaminant trap 230 can include a channel structure. Contamination trap 230 can also include a gas barrier or a combination of a gas barrier and a channel structure. The contaminant trap or contaminant barrier 230 further indicated herein at least includes a channel structure.

The collector chamber 212 can include a radiation collector CO, which may be a so-called grazing incidence collector. Radiation collector CO has an upstream radiation collector side 251 and a downstream radiation collector side 252. Radiation that traverses collector CO may be reflected off a grating spectral filter 240 to be focused in a virtual source point IF. The virtual source point IF is commonly referred to as the intermediate focus, and the source collector apparatus is arranged such that the intermediate focus IF is located at or near an opening 219 in the enclosing structure 220. The virtual source point IF is an image of the radiation emitting plasma 210. Grating spectral filter 240 is used in particular for suppressing infra-red (IR) radiation.

Subsequently the radiation traverses the illumination system IL, which can include a faceted field mirror device 222 and a faceted pupil mirror device 224 arranged to provide a desired angular distribution of the radiation beam 221, at the patterning device MA, as well as a desired uniformity of radiation intensity at the patterning device MA. Upon reflection of the beam of radiation 221 at the patterning device MA, held by the support structure MT, a patterned beam 226 is formed and the patterned beam 226 is imaged by the projection system PS via reflective elements 228, 229 onto a substrate W held by the wafer stage or substrate table WT.

More elements than shown can generally be present in illumination optics unit IL and projection system PS. The grating spectral filter 240 can optionally be present, depending upon the type of lithographic apparatus. Further, there may be more mirrors present than those shown in the FIG. 2A, for example there may be one to six additional reflective elements present in the projection system PS than shown in FIG. 2A.

Collector optic CO, as illustrated in FIG. 2A, is depicted as a nested collector with grazing incidence reflectors 253, 254, and 255, just as an example of a collector (or collector mirror). The grazing incidence reflectors 253, 254, and 255 are disposed axially symmetric around an optical axis O and a collector optic CO of this type is preferably used in combination with a discharge produced plasma source, often called a DPP source.

Figure 2B:
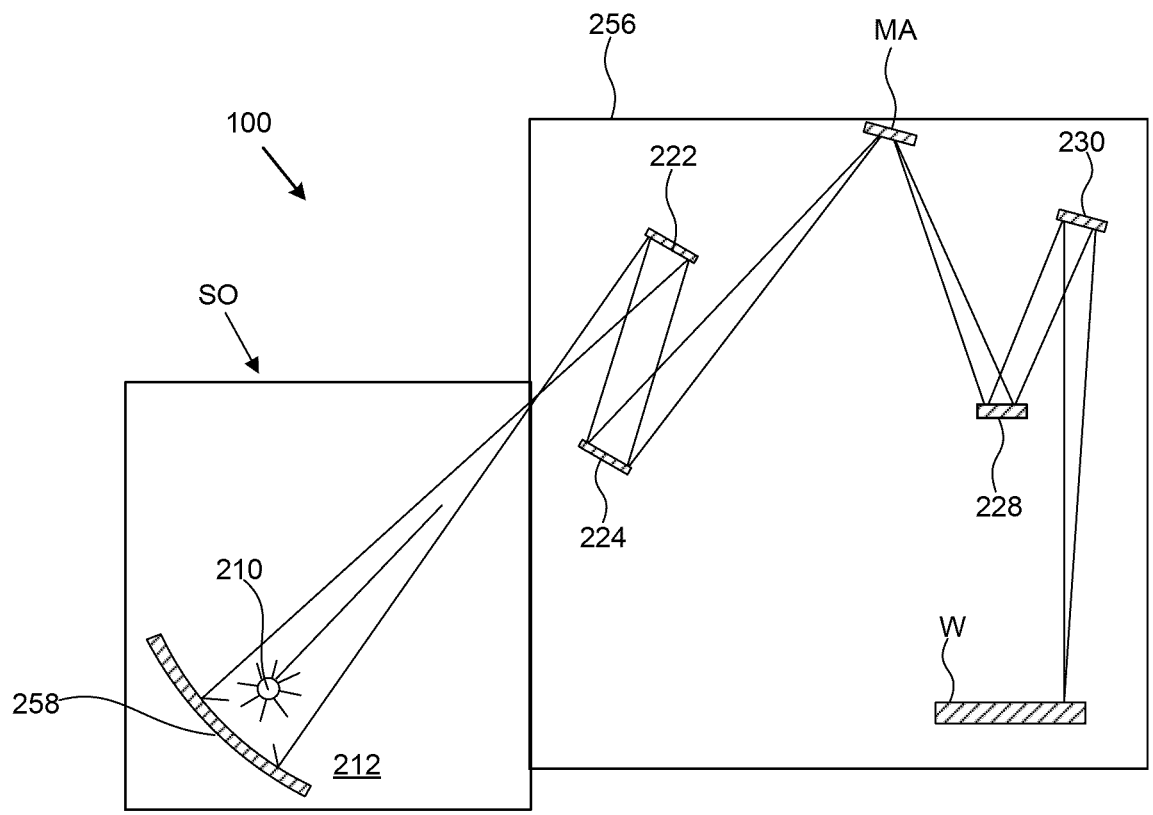

FIG. 2B shows a schematic view of selected portions of lithographic apparatus 100 (e.g., FIG. 1), but with alternative collection optics in the source collector apparatus SO, according to some embodiments. It should be appreciated that structures shown in FIG. 2A that do not appear in FIG. 2B (for drawing clarity) may still be included in embodiments referring to FIG. 2B. Elements in FIG. 2B having the same reference numbers as those in FIG. 2A have the same or substantially similar structures and functions as described in reference to FIG. 2A. In some embodiments, the lithographic apparatus 100 may be used, for example, to expose a substrate W such as a resist coated wafer with a patterned beam of EUV light. In FIG. 2B, the illumination system IL and the projection system PS are represented combined as an exposure device 256 (e.g., an integrated circuit lithography tool such as a stepper, scanner, step and scan system, direct write system, device using a contact and/or proximity mask, etc.) that uses EUV light from the source collector apparatus SO. The lithographic apparatus 100 may also include collector optic 258 that reflects EUV light from the hot plasma 210 along a path into the exposure device 256 to irradiate the substrate W. Collector optic 258 may comprise a near-normal incidence collector mirror having a reflective surface in the form of a prolate spheroid (i.e., an ellipse rotated about its major axis) having, e.g., a graded multi-layer coating with alternating layers of Molybdenum and Silicon, and in some cases, one or more high temperature diffusion barrier layers, smoothing layers, capping layers and/or etch stop layers.

Figure 3:
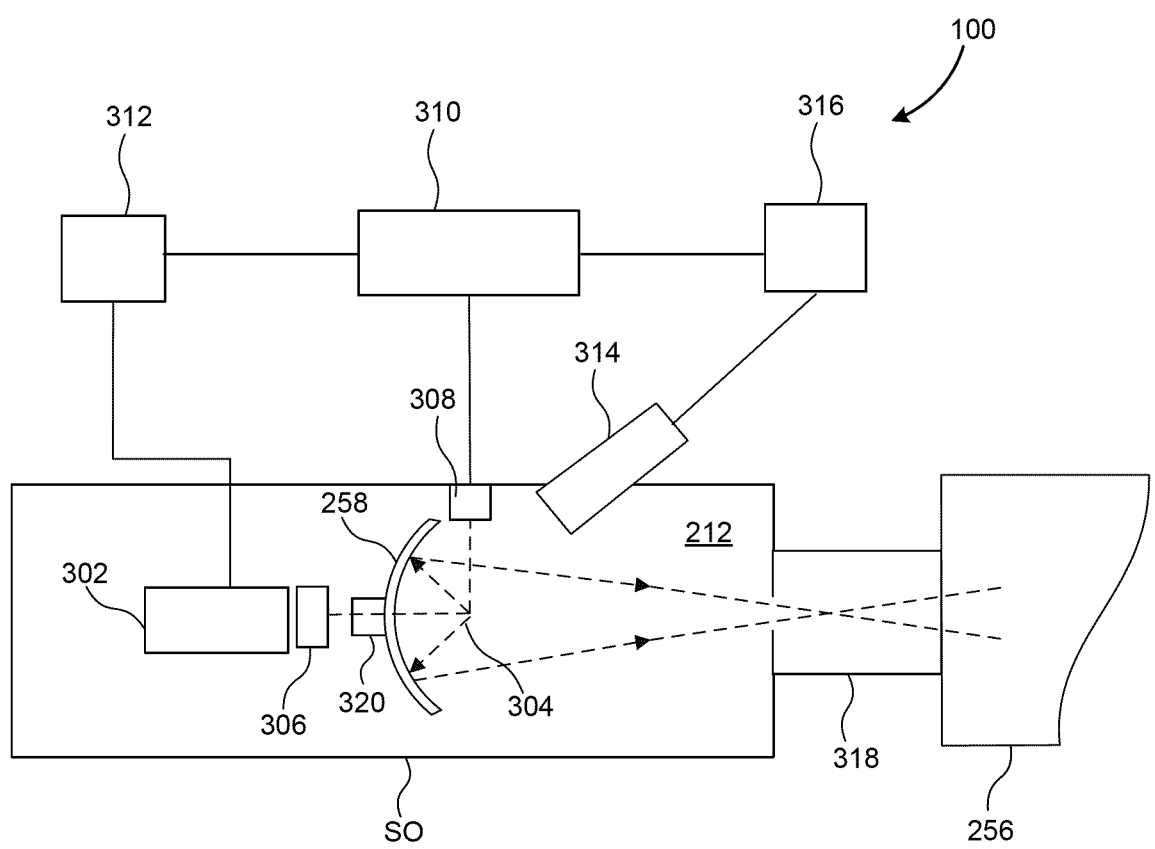

FIG. 3 shows a detailed view of a portion of lithographic apparatus 100 (e.g., FIGS. 1, 2A, and 2B), according to one or more embodiments. Elements in FIG. 3 having the same reference numbers as those in FIGS. 1, 2A, and 2B have the same or substantially similar structures and functions as described in reference to FIGS. 1, 2A, and 2B. In some embodiments, lithographic apparatus 100 may include a source collector apparatus SO having an LPP EUV light radiator. As shown, the source collector apparatus SO may include a laser system 302 for generating a train of light pulses and delivering the light pulses into a light source chamber 212. For the lithographic apparatus 100, the light pulses may travel along one or more beam paths from the laser system 302 and into the chamber 212 to illuminate a source material at an irradiation region 304 to generate a plasma (e.g., plasma region where hot plasma 210 is in FIG. 2B) that produces EUV light for substrate exposure in the exposure device 256.

In some embodiments, suitable lasers for use in the laser system 302 may include a pulsed laser device, e.g., a pulsed gas discharge $CO_2$ laser device producing radiation at 9.3 pm or 10.6 pm, e.g., with DC or RF excitation, operating at relatively high power, e.g., 10 kW or higher and high pulse repetition rate, e.g., 50 kHz or more. In some embodiments, the laser may be an axial-flow RF-pumped $CO_2$ laser having an oscillator amplifier configuration (e.g., master oscillator/power amplifier (MOPA) or power oscillator/power amplifier (POPA)) with multiple stages of amplification and having a seed pulse that is initiated by a Q-switched oscillator with relatively low energy and high repetition rate, e.g., capable of 100 kHz operation. From the oscillator, the laser pulse may then be amplified, shaped and/or focused before reaching the irradiation region 304. Continuously pumped $CO_2$ amplifiers may be used for the laser system 302. Alternatively, the laser may be configured as a so-called "self-targeting" laser system in which the droplet serves as one mirror of the optical cavity of the laser.

In some embodiments, depending on the application, other types of lasers may also be suitable, e.g., an excimer or molecular fluorine laser operating at high power and high pulse repetition rate. Some examples include, a solid state laser, e.g., having a fiber, rod, slab, or disk-shaped active media, other laser architectures having one or more chambers, e.g., an oscillator chamber and one or more amplifying chambers (with the amplifying chambers in parallel or in series), a master oscillator/power oscillator (MOPO) arrangement, a master oscillator/power ring amplifier (MOPRA) arrangement, or a solid state laser that seeds one or more excimer, molecular fluorine or $CO_2$ amplifier or oscillator chambers, may be suitable. Other suitable designs may be envisioned.

In some embodiments, a source material may first be irradiated by a pre-pulse and thereafter irradiated by a main pulse. Pre-pulse and main pulse seeds may be generated by a single oscillator or two separate oscillators. One or more common amplifiers may be used to amplify both the pre-pulse seed and main pulse seed. In some embodiments, separate amplifiers may be used to amplify the pre-pulse and main pulse seeds.

In some embodiments, the lithographic apparatus 100 may include a beam conditioning unit 306 having one or more optics for beam conditioning such as expanding, steering, and/or focusing the beam between the laser system 302 and irradiation region 304. For example, a steering system, which may include one or more mirrors, prisms, lenses, etc., may be provided and arranged to steer the laser focal spot to different locations in the chamber 212. For example, the steering system may include a first flat mirror mounted on a tip-tilt actuator which may move the first mirror independently in two dimensions, and a second flat mirror mounted on a tip-tilt actuator which may move the second mirror independently in two dimensions. With the described arrangement(s), the steering system may controllably move the focal spot in directions substantially orthogonal to the direction of beam propagation (beam axis or optical axis).

The beam conditioning unit 306 may include a focusing assembly to focus the beam to the irradiation region 304 and adjust the position of the focal spot along the beam axis. For the focusing assembly, an optic, such as a focusing lens or mirror, may be used that is coupled to an actuator for movement in a direction along the beam axis to move the focal spot along the beam axis.

In some embodiments, the source collector apparatus SO may also include a source material delivery system 308, e.g., delivering source material, such as tin droplets, into the interior of chamber 212 to an irradiation region 304, where the droplets will interact with light pulses from the laser system 302, to ultimately produce plasma and generate an EUV emission to expose a substrate such as a resist coated wafer in the exposure device 256. More details regarding various droplet dispenser configurations may be found in, e.g., U.S. Pat. No. 7,872,245, issued on Jan. 18, 2011, titled "Systems and Methods for Target Material Delivery in a Laser Produced Plasma EUV Light Source", U.S. Pat. No. 7,405,416, issued on Jul. 29, 2008, titled "Method and Apparatus For EUV Plasma Source Target Delivery", U.S. Pat. No. 7,372,056, issued on May 13, 2008, titled "LPP EUV Plasma Source Material Target Delivery System", and International Appl. No. WO 2019/137846, titled "Apparatus for and Method of Controlling Coalescence of Droplets In a Droplet Stream", published on Jul. 18, 2019, the contents of each of which are incorporated by reference herein in their entirety.

In some embodiments, the source material for producing an EUV light output for substrate exposure may include, but is not necessarily limited to, a material that includes tin, lithium, xenon or combinations thereof. The EUV emitting element, e.g., tin, lithium, xenon, etc., may be in the form of liquid droplets and/or solid particles contained within liquid droplets. For example, the element tin may be used as pure tin, as a tin compound, e.g., $SnBr_4$, $SnBr_2$, $SnH_4$, as a tin alloy, e.g., tin-gallium alloys, tin-indium alloys, tin-indium-gallium alloys, or a combination thereof. Depending on the material used, the source material may be presented to the irradiation region at various temperatures including room temperature or near room temperature (e.g., tin alloys, $SnBr_4$), at an elevated temperature, (e.g., pure tin) or at temperatures below room temperature, (e.g., $SnH_4$), and in some cases, can be relatively volatile, e.g., $SnBr_4$.

In some embodiments, the lithographic apparatus 100 may also include a controller 310, which may also include a drive laser control system 312 for controlling devices in the laser system 302 to thereby generate light pulses for delivery into the chamber 212, and/or for controlling movement of optics in the beam conditioning unit 306. The lithographic apparatus 100 may also include a droplet position detection system which may include one or more droplet imagers 314 that provide an output signal indicative of the position of one or more droplets, e.g., relative to the irradiation region 304. The droplet imager(s) 314 may provide this output to a droplet position detection feedback system 316, which can, e.g., compute a droplet position and trajectory, from which a droplet error can be computed, e.g., on a droplet-by-droplet basis, or on average. The droplet error may then be provided as an input to the controller 310, which can, for example, provide a position, direction and/or timing correction signal to the laser system 302 to control laser trigger timing and/or to control movement of optics in the beam conditioning unit 306, e.g., to change the location and/or focal power of the light pulses being delivered to the irradiation region 304 in the chamber 212. Also for the source collector apparatus SO, the source material delivery system 308 may have a control system operable in response to a signal (which in some implementations may include the droplet error described above, or some quantity derived therefrom) from the controller 310, to e.g., modify the release point, initial droplet stream direction, droplet release timing and/or droplet modulation to correct for errors in the droplets arriving at the irradiation region 304.

In some embodiments, the lithographic apparatus 100 may also include a gas dispenser device 320. Gas dispenser device 320 may dispense gas in the path of the source material from the source material delivery system 308 (e.g., irradiation region 304). Gas dispenser device 320 may comprise a nozzle through which dispensed gas may exit. Gas dispenser device 320 may be structured (e.g., having an aperture) such that, when placed near the optical path of laser system 302, light from laser system 302 is not blocked by gas dispenser device 320 and is allowed to reach the irradiation region 304. A buffer gas such as hydrogen, helium, argon or combinations thereof, may be introduced into, replenished and/or removed from the chamber 212. The buffer gas may be present in the chamber 212 during plasma discharge and may act to slow plasma created ions, to reduce degradation of optics, and/or increase plasma efficiency. Alternatively, a magnetic field and/or electric field (not shown) may be used alone, or in combination with a buffer gas, to reduce fast ion damage.

In some embodiments, the lithographic apparatus 100 may also include a collector optic 258 such as a near-normal incidence collector mirror having a reflective surface in the form of a prolate spheroid (i.e., an ellipse rotated about its major axis) having, e.g., a graded multi-layer coating with alternating layers of Molybdenum and Silicon, and in some cases, one or more high temperature diffusion barrier layers, smoothing layers, capping layers and/or etch stop layers. Collector optic 258 may be formed with an aperture to allow the light pulses generated by the laser system 302 to pass through and reach the irradiation region 304. The same, or another similar aperture, may be used to allow gas from the gas dispenser device 320 to flow into chamber 212. As shown, the collector optic 258 may be, e.g., a prolate spheroid mirror that has a first focus within or near the irradiation region 304 and a second focus at a so-called intermediate region 318, where the EUV light may be output from the source collector apparatus SO and input to an exposure device 256 utilizing EUV light, e.g., an integrated circuit lithography tool. It is to be appreciated that other optics may be used in place of the prolate spheroid mirror for collecting and directing light to an intermediate location for subsequent delivery to a device utilizing EUV light. Embodiments using the collector optic CO (FIG. 2A) with structures and functions described in reference to FIG. 3 may also be envisioned.

Exemplary Lithographic Cell

Figure 4:
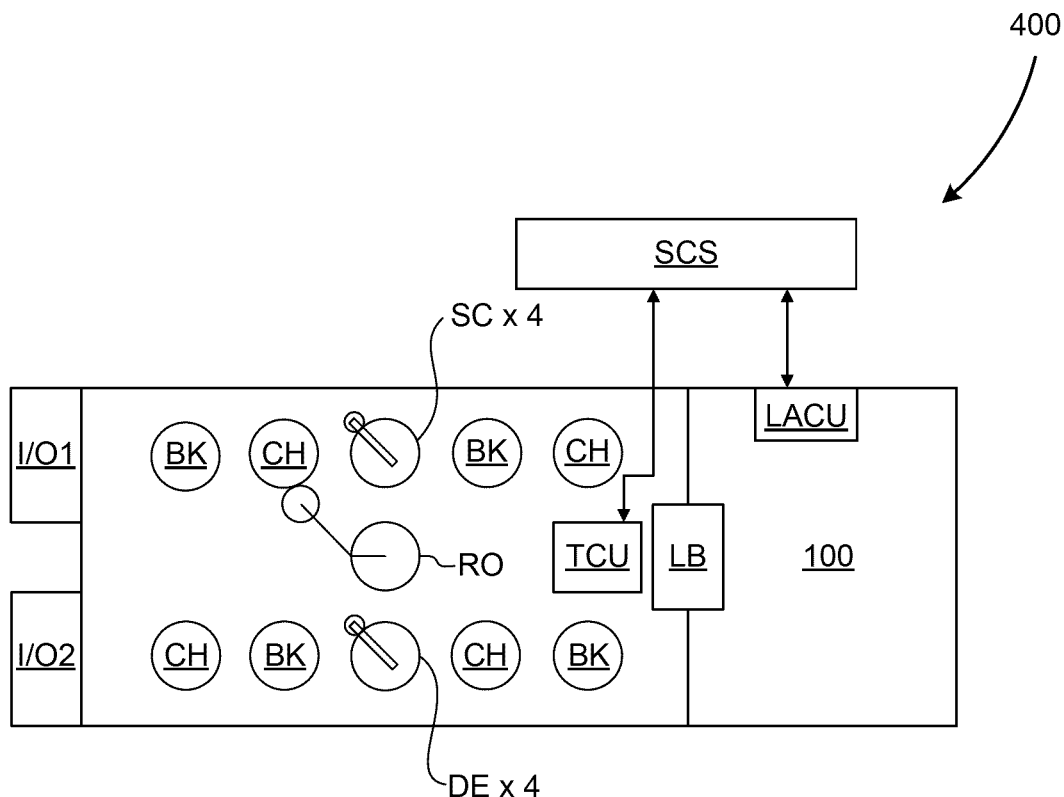
FIG. 4 shows a schematic of a lithographic cell, according to some embodiments.

FIG. 4 shows a lithographic cell 400, also sometimes referred to a lithocell or cluster, according to some embodiments. Lithographic apparatus 100 may form part of lithographic cell 400. Lithographic cell 400 may also include one or more apparatuses to perform pre- and post-exposure processes on a substrate. Conventionally these include spin coaters SC to deposit resist layers, developers DE to develop exposed resist, chill plates CH, and bake plates BK. A substrate handler, or robot, RO picks up substrates from input/output ports I/O1, I/O2, moves them between the different process apparatuses and delivers them to the loading bay LB of the lithographic apparatus 100. These devices, which are often collectively referred to as the track, are under the control of a track control unit TCU, which is itself controlled by a supervisory control system SCS, which also controls the lithographic apparatus via lithography control unit LACU. Thus, the different apparatuses may be operated to maximize throughput and processing efficiency.

Exemplary Plasma Material Droplet Source and Exemplary Droplet Generators

Figure 5:
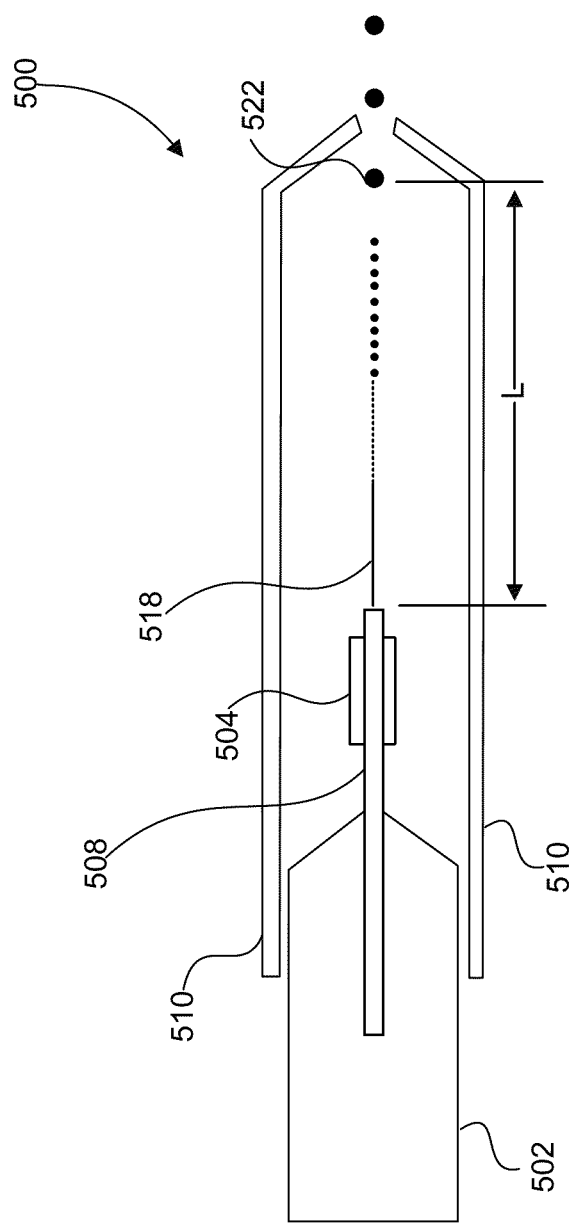
FIG. 5 shows a schematic of a source material delivery system, according to some embodiments.

FIG. 5 shows a schematic of a source material delivery system 500, according to some embodiments. In some embodiments, source material delivery system 500 may be used in a lithographic apparatus 100 (e.g., source material delivery system 90 in FIG. 3). Source material delivery system 500 may comprise a nozzle 502, an electromechanical element 504, and a shroud 510. Nozzle 502 may comprise a capillary 508.

As used herein, the term "electromechanical," "electroactuatable," and the like may refer to a material or structure which undergoes a dimensional change (e.g., movement, deflection, contraction, and the like) when subjected to a voltage, electric field, magnetic field, or combinations thereof and includes, but is not limited to, piezoelectric materials, electrostrictive materials, and magnetostrictive materials. Apparatuses and methods for using an electro-actuatable element to control a droplet stream are disclosed, for example, in U.S. Pub. Appl. No. 2009/0014668, titled "Laser Produced Plasma EUV Light Source Having a Droplet Stream Produced Using a Modulated Disturbance Wave" and published Jan. 15, 2009, and U.S. Pat. No. 8,513,629, titled "Droplet Generator with Actuator Induced Nozzle Cleaning" and issued Aug. 20, 2013, both of which are incorporated by reference herein in their entireties.

In some embodiments, electromechanical element 504 may be disposed on (e.g., surrounding) a portion of nozzle 502. It should be appreciated that interactions between nozzle 502 and electromechanical element 504 described herein may be directed to interactions between a pressure-sensitive element of nozzle 502 and electromechanical element 504 (e.g., electromechanical element 504 is disposed on capillary 508). In some embodiments, electromechanical element 504 may be electrically coupled to a waveform generator (not shown) to generate an electrical signal to control the applied pressure on nozzle 502.

In some embodiments, nozzle 502 may eject droplets of target material, shown in FIG. 5 as a stream of target material 518. Electromechanical element 504 may transduce electrical energy from a waveform generator to apply a pressure on nozzle 502 (e.g., on capillary 508). This may introduce a velocity perturbation in stream of target material 518 exiting nozzle 502. Stream of target material 518 ultimately coalesces into droplets 522. In some embodiments, a fully coalesced droplet 522 may form at a distance L ("coalescence length") from the orifice of nozzle 502.

Figure 6:
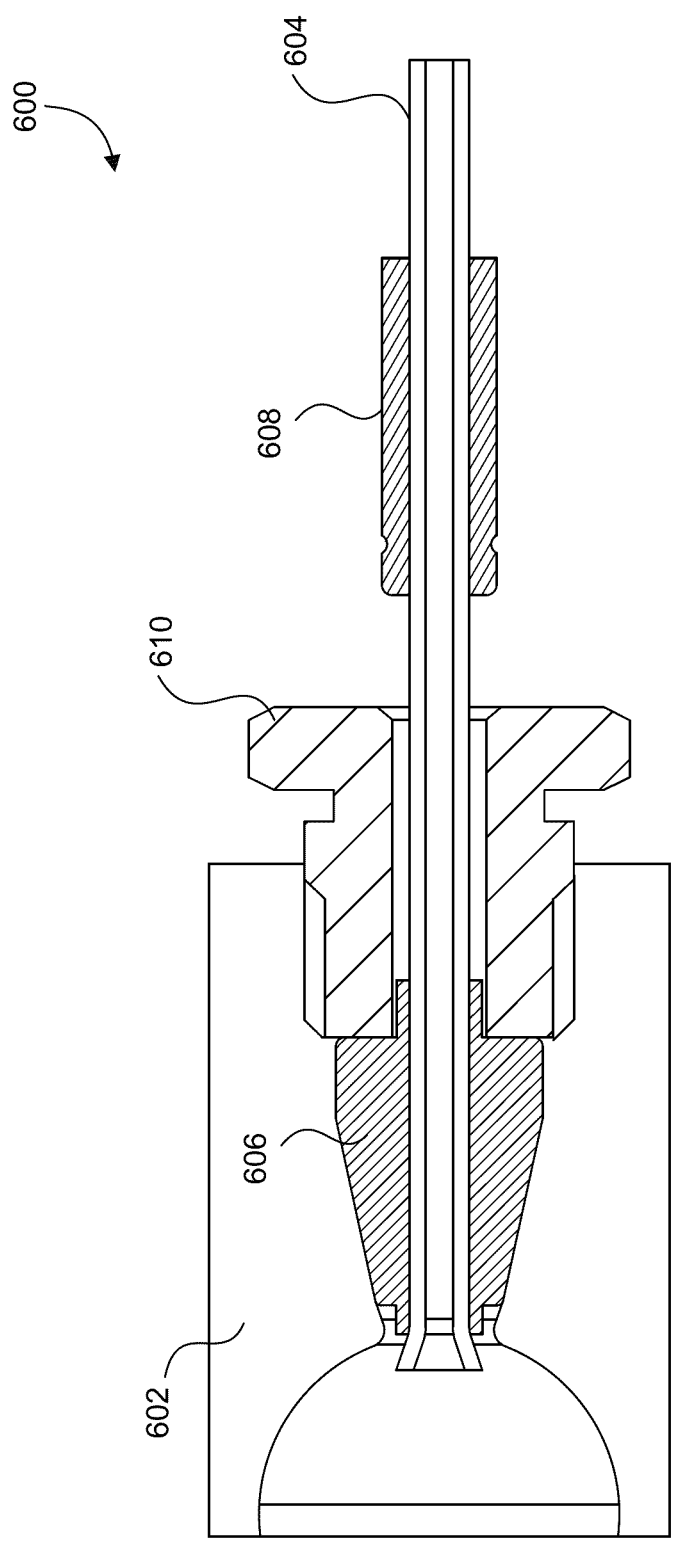
FIG. 6 shows a schematic of a droplet generator nozzle, according to some embodiments.

FIG. 6 shows a schematic of a droplet generator nozzle 600, according to some embodiments. In some embodiments, droplet generator nozzle 600 may be used in a lithographic apparatus 100 (e.g., in source material delivery system 308 in FIG. 3). Droplet generator nozzle 600 may comprise metal fitting 602, capillary 604, ferrule 606, electromechanical element 608, and fastener element 610. In some embodiments, capillary 604 and electromechanical element 608 may represent exemplary embodiments of capillary 508 and electromechanical element 504, respectively, of the source material delivery system 500 shown in FIG. 5.

In some embodiments, a EUV-generating-plasma may be generated by irradiating target material (e.g., Sn) with a laser, which ionizes the target material (i.e., excitation). The target material may be provided as a stream of coalesced droplets that exit from capillary 604 in the droplet generator nozzle 600. Capillary 604 may comprise a glass or quartz capillary tube that is fed with a target material (e.g., liquid tin) under high pressure to produce a high velocity stream of the target material.

Electromechanical element 608 may be mechanically coupled or attached to capillary 604 via an adhesive to control the formation of droplets from capillary 604. In some embodiments, electromechanical element 608 may comprise a piezoelectric actuator, modulator, or another structure that undergoes a dimensional change (e.g., movement, deflection, contraction, and the like) when subjected to a voltage, electric field, magnetic field, or combinations thereof. In some embodiments, electromechanical element 608 may be tubular and apply pressure radially to the capillary 604. In some embodiments, electromechanical element 608 may be actuated with high frequency voltage to provide modulation to a tin stream and enable controlled formation of droplets. As previously discussed, the droplets may be used in a EUV source to create plasma that emits EUV radiation.

In some embodiments, metal fitting 602 and fastener element 610 may comprise metal components that are utilized to assemble components of droplet generator nozzle 600 together, such as for coupling of the ferrule 606 with capillary 604 and electromechanical element 608. In some embodiments, metal fitting 602 and fastener element 610 may comprise materials such as at least one of molybdenum, tantalum, tungsten, or other metals/metal alloys. In some embodiments, one or more materials for metal fitting 602 and fastener element 610 may be selected based on a material's coefficient of thermal expansion, strength of a material at elevated temperatures, chemical stability of a material in the droplet generator environment (e.g., stability of a material when exposed to hydrogen, tin, and the like.), and/or mechanical stability of a material during loading cycles (e.g., pressure, temperature, and the like). In some embodiments, ferrule 606 may comprise a soft material used to align and protect the end of capillary 604. Ferrule 606 may provide a polymer-based seal between rigid components, such as providing a seal between metal fitting 602, capillary 604, and fastener element 610. In some embodiments, ferrule 606 may degrade over time and might not be able to withstand higher temperatures (e.g., about 260° Celsius) without losing functionality.

In some embodiments, the diameter and wall thickness of capillary 604 in droplet generator nozzle 600 may be restricted in order to enable actuation by electromechanical element 608. In some cases, the wall thickness of capillary 604 might not exceed a predetermined threshold of about 0.25 mm, which may limit the pressure that may be applied to the tin in the capillary 604. Reduced pressures may hinder with droplet generation and corresponding properties, such as spacing of droplets, repetition rates, and the like. In some embodiments, the inner diameter of capillary 604 may be about 0.5 mm, and the outer diameter of capillary 604 may be about 1.0 mm, but other dimensions may be used in other embodiments.

Furthermore, in some embodiments, capillary 604 may comprise a long, thin, and cantilevered capillary that has limited stiffness due to its small diameter. Capillary 604 may be prone to vibration, resulted in unwanted variability in droplet trajectory and overall droplet instability. In some embodiments, ferrule 606 which is used to seal the glass capillary 604 may comprise a compliant material, further reducing stiffness and enabling vibration in droplet generator nozzle 600. In some embodiments, a compliant material may refer to a material that is easily deformed elastically. In some embodiments, a compliant material may be a bendable or malleable material, such as a polyimide material, which is less stiff than metal materials such as molybdenum. By using a compliant material, deformation of ferrule 606 during operation may also result in tin jet misalignment.

Additionally, in some embodiments, the adhesive or glue used to attach a tubular electromechanical element 608 to capillary 604 may degrade over time and change actuation transfer characteristics, which may result in satellite droplets. In some embodiments, there may be wires attached to electromechanical element 608 that cause asymmetry in droplet generator nozzle 600, resulting in self-induced vibration of capillary 604 and droplet instability. Moreover, in some embodiments, the functionality of the droplet generator nozzle 600 may be tested solely after full assembly, which may difficult for troubleshooting potential issues.

Figure 7:
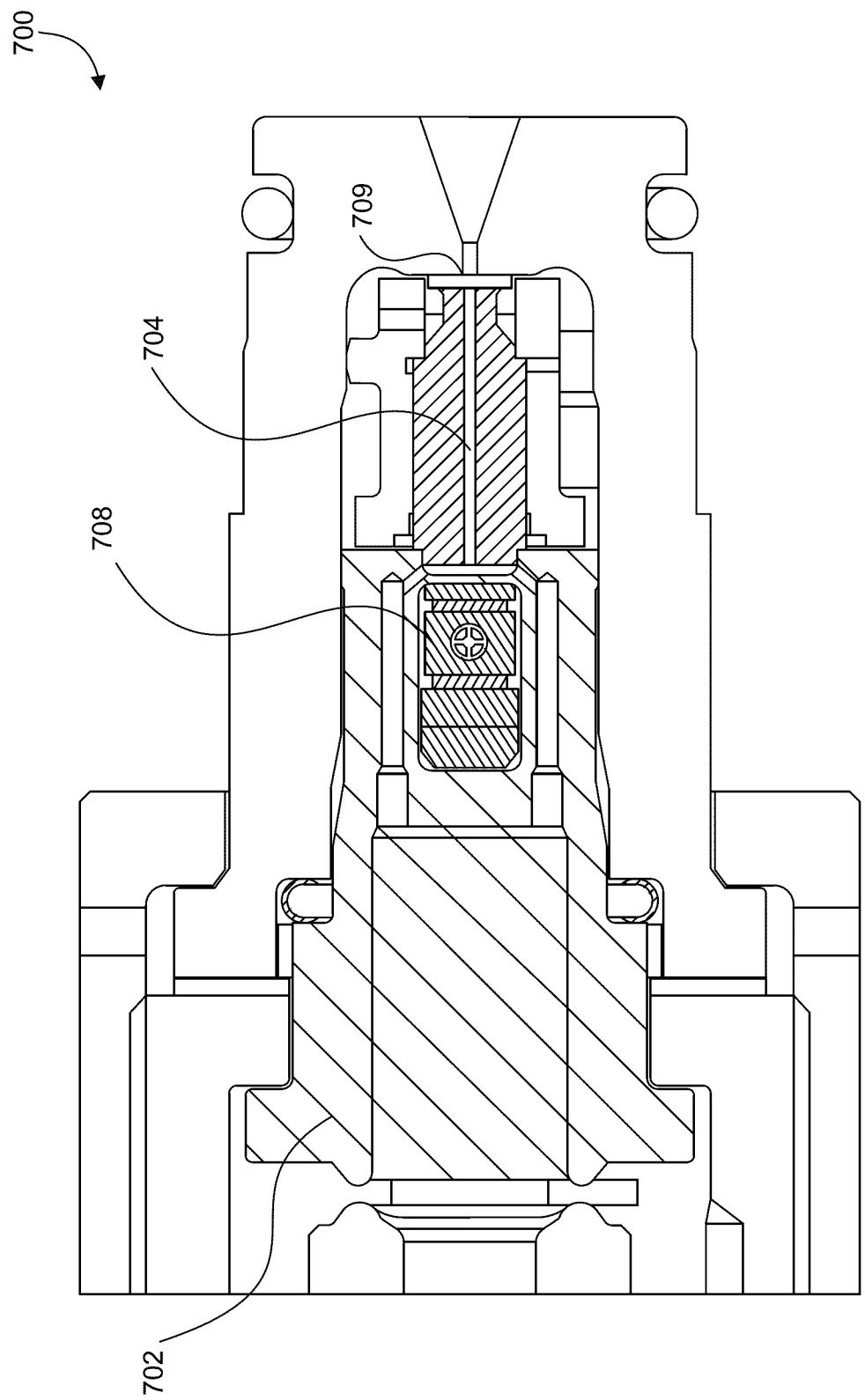
FIG. 7 shows a schematic of another droplet generator nozzle, according to some embodiments.

FIG. 7 shows a schematic of another droplet generator nozzle 700, according to some embodiments. In some embodiments, droplet generator nozzle 700 may be used in a lithographic apparatus 100 (e.g., in source material delivery system 308 in FIG. 3). Droplet generator nozzle 700 may comprise metal fitting 702, capillary 704, electromechanical element 708, and orifice 709. In some embodiments, metal fitting 702, capillary 704, and electromechanical element 708 may represent exemplary embodiments of metal fitting 602, capillary 508, 604, and electromechanical element 504, 608, respectively, of the source material delivery system 500 and droplet generator nozzle 600 shown in FIGS. 5 and 6, respectively.

In some embodiments, droplet generator nozzle 700 may differ from droplet generator nozzle 600 in that electromechanical element 708 may be removed from capillary 704 and incorporated as a module in metal fitting 702. In some embodiments, electromechanical element 708 may be a piezoelectric stack comprising multiple piezo elements that are layered on top of each other to form a stacked piezo actuator. In some embodiments, electromechanical element 708 may utilize an adhesive such as a glue. The adhesive in electromechanical element 708 may be under compression, which may result in a lower risk of delamination or changes to droplet generator performance in comparison to the adhesive layer used in electromechanical element 608 of droplet generator nozzle 600. As shown in FIG. 7, a cylindrical or round spout may be drilled or machined to form orifice 709 in droplet generator nozzle 700. In some embodiments, orifice 709 may comprise a thin plate (e.g., circular, square-shaped, or the like) with an opening for passage with a diameter of about 1 to 3 um, but other dimensions may be used in other embodiments.

In some embodiments, manufacturing of droplet generator nozzle 700 may be challenging with respect to a consistent production of an orifice 709 that meets predetermined specifications. In some embodiments, it may be challenging to produce an orifice 709 with an accurate size in the 1 to 3 um range. Additionally, the nozzle assembly of droplet generator nozzle 700 might not be flushed out appropriately before the orifice 709 is produced, resulting in frequent contamination and orifice blockage.

In some embodiments, droplets that are produced from capillary 704 may be non-uniform and unstable, as a result of vibrations occurring in droplet generator 700. In some cases, instability and unpredictability of target material droplets may affect efficiency and stability of EUV radiation, which in turn may impact lithographic processes that depend on the EUV radiation. Furthermore, in some embodiments, droplet generator 700 may have contamination and manufacturing issues that may hinder production and operation of an efficient droplet generator for generating EUV radiation. Therefore, it may be desirable to provide droplet generator nozzle designs that avoid issues such as capillary instability, orifice blockages, gradual deformation (creep) of the ferrule (e.g., ferrule 606), and the like.

Structures and functions in embodiments of the present disclosure allow for reduced vibrations in a droplet generator nozzle and droplet generation with improved droplet stability.

Exemplary Embodiments of a Hybrid Droplet Generator Nozzle

Figure 8A:
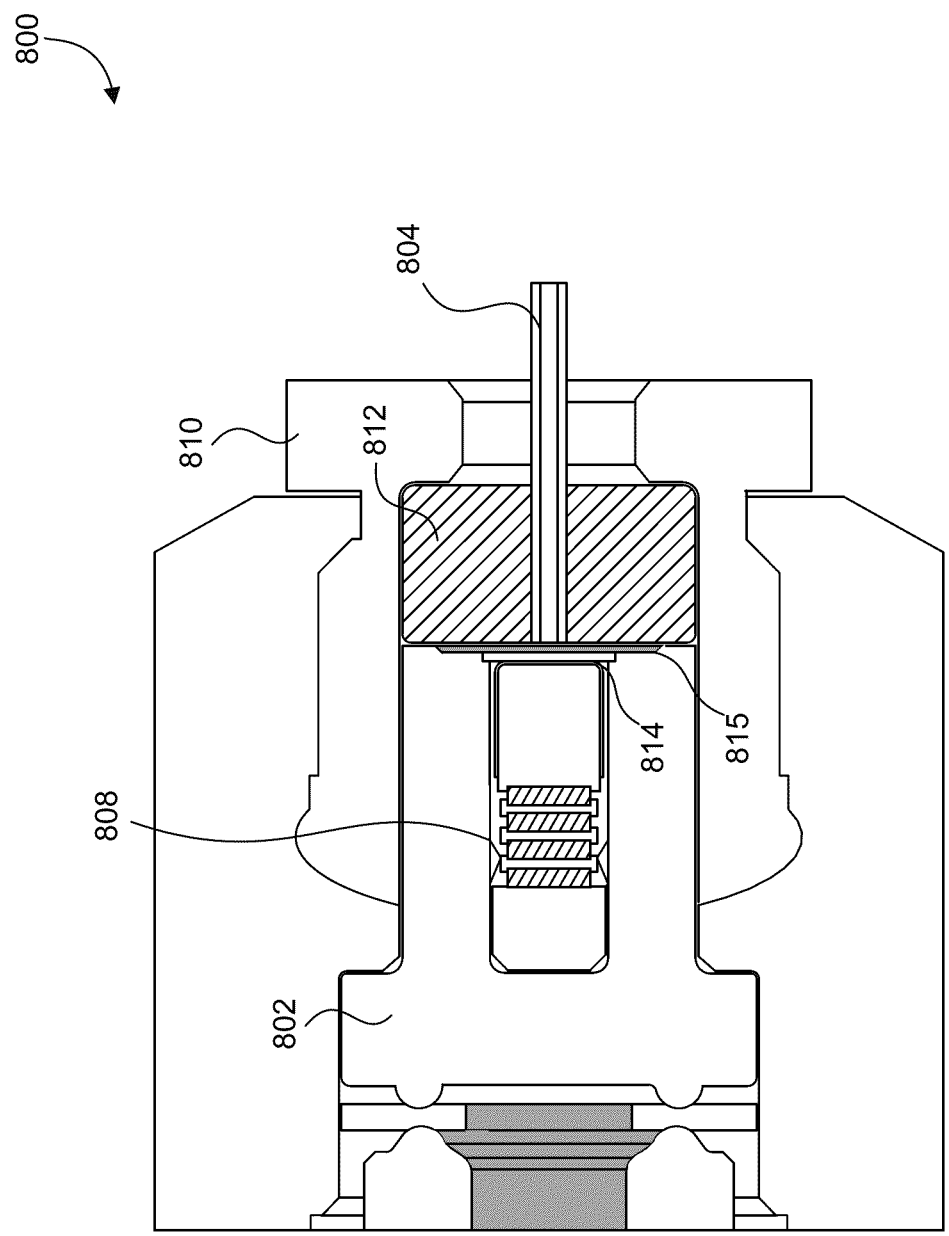
FIG. 8A shows a schematic of a hybrid droplet generator nozzle, according to some embodiments.

FIG. 8A shows a schematic of a hybrid droplet generator nozzle 800, according to some embodiments. In some embodiments, a hybrid droplet generator nozzle 800 may be used in a lithographic apparatus 100 (e.g., in source material delivery system 308 in FIG. 3). In some embodiments, hybrid droplet generator nozzle 800 may be referred to herein as nozzle 800 or droplet generator nozzle 800 for simplicity. Droplet generator nozzle 800 may comprise metal body 802, capillary 804, electromechanical element 808, fastener element 810, metal fitting 812, membrane 814, and pump chamber 815.

In some embodiments, capillary 804 may represent exemplary embodiments of capillaries 508, 604, 704 of the source material delivery system 500, droplet generator nozzle 600, droplet generator nozzle 700, shown in FIGS. 5, 6, and 7, respectively. Electromechanical element 808 may be formed of similar materials as electromechanical elements 504 608, 708 respectively, of the source material delivery system 500, droplet generator nozzle 600, droplet generator nozzle 700, shown in FIGS. 5, 6, and 7, respectively. As shown in FIG. 8A, metal fitting 812 may be arranged adjacent to metal body 802. Capillary 804 comprises a first end and a second end, in which the first end is arranged within the metal fitting 812. Capillary 804 may be configured to eject initial droplets of a material through a gas from an orifice at the second end of capillary 804.

In some embodiments, the design of droplet generator nozzle 800 may allow for the diameter of capillary 804 to be selected (e.g., selection of a higher outer diameter), resulting in a higher tin pressure limit and higher stiffness to reduce vibration amplitude and resonance frequency for improving droplet stability. The shorter length of capillary 804 (in comparison to capillary 604 and capillary 704 of FIGS. 6 and 7) may further improve stiffness and reduce vibrations.

Figure 8B:
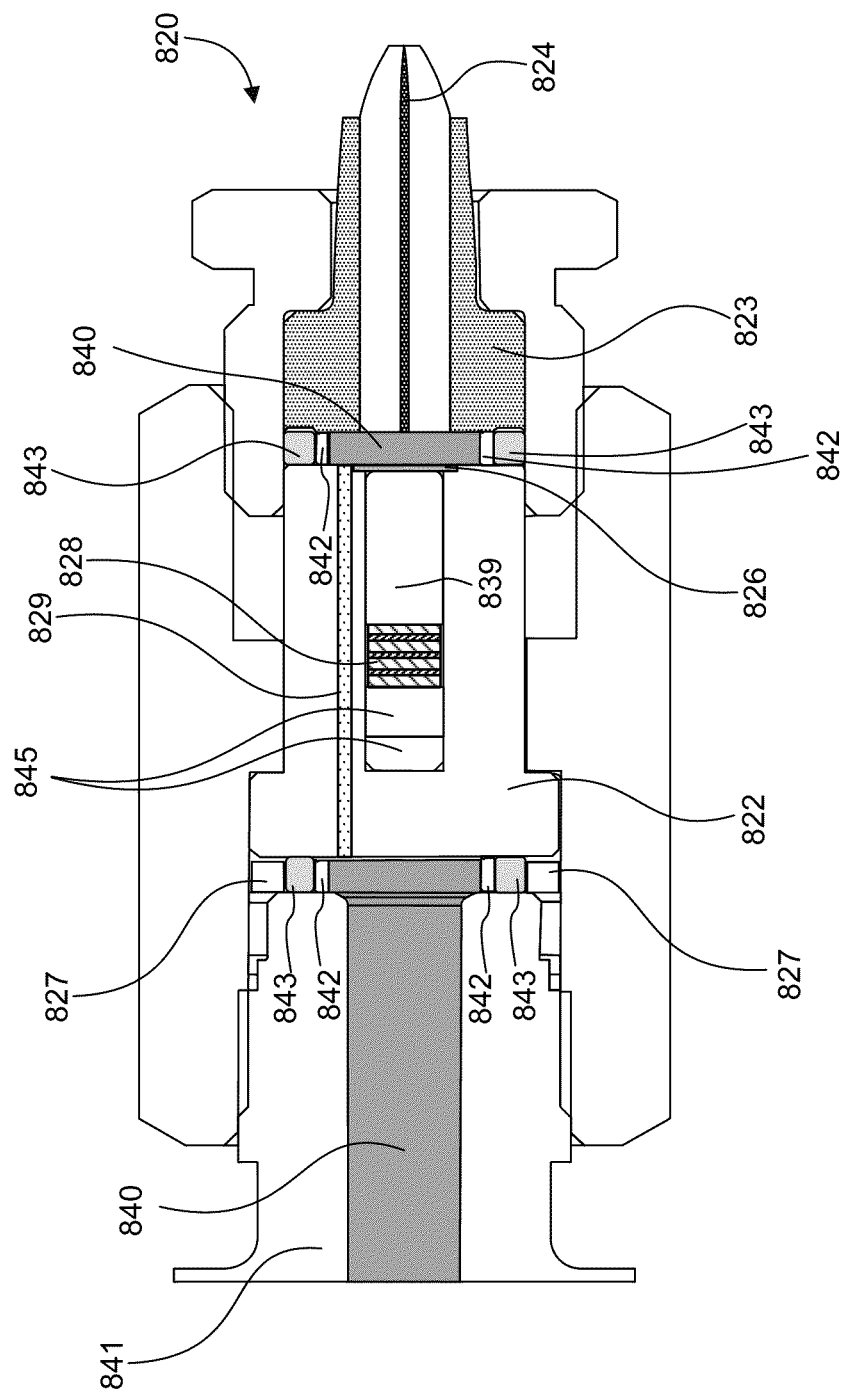
FIG. 8B shows a second schematic of a hybrid droplet generator nozzle, according to some embodiments.
Figure 8C:
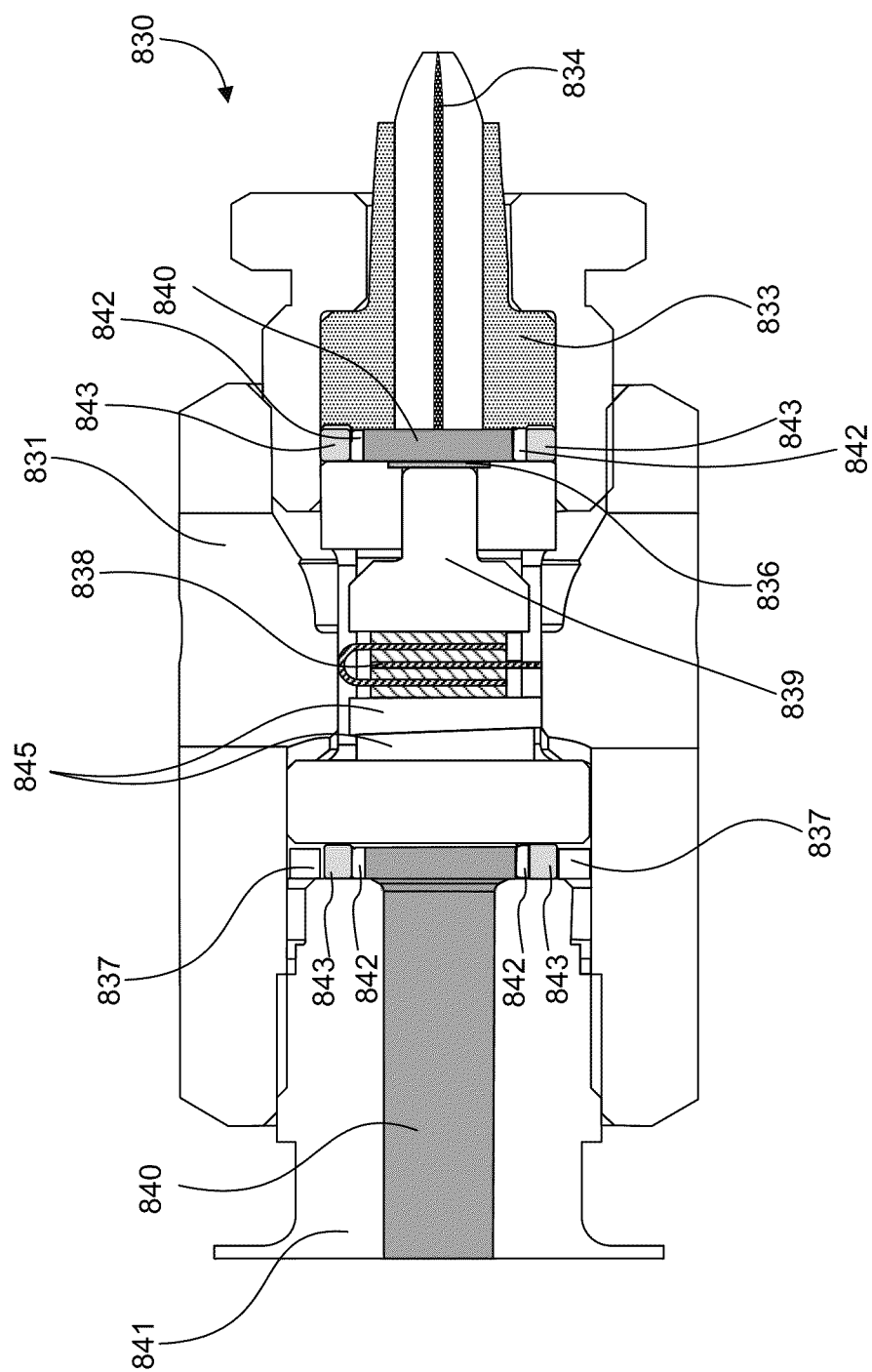
FIG. 8C shows a third schematic of a hybrid droplet generator nozzle, according to some embodiments.

Electromechanical element 808 may be disposed within metal body 802 and coupled to or near the first end of capillary 804. In some embodiments, electromechanical element 808 may be configured to apply a change that results in droplet generation from the capillary 804. In some embodiments, electromechanical element 808 may deform membrane 814, and the membrane 814 may displace a predetermined amount (e.g., a finite volume) of material used for droplet generation (e.g., liquid Sn). In some embodiments, the electromechanical element 808 pushes on a pin element (e.g., pin 839 shown in FIG. 8B), which is a mechanical connection between the electromechanical element and the membrane as shown in FIGS. 8B and 8C. In some embodiments, due to the rapid displacement of the fluid, an acoustic wave may start traveling in the material volume. The acoustic wave may travel through the capillary 804 to the orifice at the second end of the capillary 804. In some embodiments, pressure fluctuations in the orifice may accelerate or decelerate the fluid, resulting in velocity fluctuations in the liquid Sn that is ejected by the droplet generator nozzle 800. In some embodiments, these velocity fluctuations may control the droplet formation and the droplet coalescence from the orifice at the second end of the capillary 804.

In some embodiments, the change applied by electromechanical element 808 causes a change in a volume of the material used for the droplet generation. In some embodiments, the change applied by electromechanical element 808 that results in droplet generation from the capillary 804 causes a change in pressure of the material used for the droplet generation. In some embodiments, electromechanical element 808 may be a piezoelectric stack comprising multiple piezo elements that are layered on top of each other to form a stacked piezo actuator. In some embodiments, electromechanical element 808 may utilize an adhesive such as a glue. The adhesive in electromechanical element 808 may be under compression, which may result in a lower risk of delamination or changes to droplet generator performance in comparison to the adhesive layer used in electromechanical element 608 of droplet generator nozzle 600. In some embodiments, electromechanical element 808 may be modular, such that an electromechanical module (e.g., a piezoelectric module) may be replaceable without requiring complete disassembly of the entire droplet generator nozzle 800. In some embodiments, the modular design droplet generator nozzle 800 may allow testing of the functionality of the individual components before assembly, enabling quality control early in the manufacturing process of droplet generator nozzle 800.

In some embodiments, by moving electromechanical element 808 upstream in droplet generator nozzle 800, such that electromechanical element 808 does not directly surround capillary 804, capillary 804 has greater stability and a reduction in vibrations, which allows for an improvement of control in droplet generation from droplet generator nozzle 800. Additionally, any wiring for electromechanical element 808 may be kept within a modular element in metal body 802 of droplet generator nozzle 800 and away from capillary 804.

In some embodiments, metal body 802, fastener element 810, and metal fitting 812 may comprise metal components that are utilized to assemble components of droplet generator nozzle 800 together, such as for coupling of capillary 804 with electromechanical element 808. In some embodiments, metal body 802, fastener element 810, and metal fitting may provide clamping force to form a strong seal between components of droplet generator nozzle 800. In some embodiments, metal body 802, fastener element 810, and metal fitting 812 may comprise materials such as such as at least one of molybdenum, tantalum, tungsten, or other metals/metal alloys. In some embodiments, a Kovar (a nickel-cobalt ferrous alloy) with a tin-compatible coating, such as aluminosilicate glass may be utilized. In some embodiments, one or more materials for metal body 802, fastener element 810, and metal fitting 812 may be selected based on a material's coefficient of thermal expansion, strength of a material at elevated temperatures, chemical stability of a material in the droplet generator environment (e.g., stability of a material when exposed to hydrogen, tin, and the like.), and/or mechanical stability of a material during loading cycles (e.g., pressure, temperature, and the like). In some embodiments, capillary 804 may comprise borosilicate or aluminosilicate.

In some embodiments, metal fitting 812 may provide a seal (e.g., a glass-to-metal seal) around the first end of capillary 804. By utilizing metal fitting 812 (rather than a soft material ferrule, such as ferrule 606 shown in FIG. 6), capillary 804 may be stabilized, and vibrations of capillary 804 may be reduced. Furthermore, the glass-to-metal seal provided by metal fitting 812 may not degrade over time, thus allowing longer nozzle life. In some embodiments, metal fitting 812 may be able to withstand higher temperatures and higher pressures (e.g., about 4,000 psi to 20,000 psi) without losing functionality In some embodiments, metal fitting 812 improves stability of capillary 804, resulting in improved droplet stability. In some embodiments, droplet stability may indicate that droplets produced by capillary 804 may pass through the same contact points in droplet generator nozzle 800 and that droplets may have the same velocity and same direction.

In some embodiments, membrane 814 and pump chamber 815 may be arranged at an interface between metal body 802 and the first end of capillary 804. In some embodiments, the membrane 814 may be configured to separate the material used for droplet generation from electromechanical element 808.

In some embodiments, the function of the membrane may be to prevent the Sn from wetting the electromechanical element 808 and allow the mechanical displacement caused by the electromechanical element through to the Sn. In some embodiments, the pump chamber, the throttle, and the inner diameter of the capillary 804 may form the main acoustical volume of the droplet generator nozzle 800. The electromechanical element 808 may deform the membrane, and the membrane may displace a finite amount of liquid Sn in the pump chamber. In some embodiments, the design of the pump chamber and the throttle may determine the acoustic response of the Sn in the pump chamber. In some embodiments, there may be acoustical resonances defined by the geometric parameters of the throttle, pump chamber and capillary 804. The rapid displacement of the fluid near the membrane may cause an acoustic wave. The acoustic wave may start traveling in the Sn volume, from the pump chamber to the throttle and the capillary 804. The pressure wave in the capillary 804 may travels to the orifice at the second end of the capillary 804. In some embodiments, pressure fluctuations in the orifice may accelerate or decelerate the fluid, resulting in velocity fluctuations in the Sn that is ejected by the droplet generator nozzle 800. In some embodiments, these velocity fluctuations may control the droplet formation and the droplet coalescence from the orifice at the second end of the capillary 804.

In some embodiments, droplet generator nozzle 800 may reduce nozzle tip displacement (e.g., increase droplet stability) and allow for tuning of resonance frequencies for controlling droplet generation. For example, capillary 804 in droplet generator nozzle 800 with a 2.0 mm outer diameter may result in a nozzle tip displacement of 0.026 mm/N and a lowest resonance frequency of 5,400 Hz, whereas capillary 804 in droplet generator nozzle 800 with a 3.8 mm outer diameter may result in a nozzle tip displacement of 0.003 mm/N and a lowest resonance frequency of 9,500 Hz. Furthermore, in some embodiments, capillary 804 with a larger outer diameter (e.g., with a constant inner diameter) may be chosen to tolerate higher pressures.

FIG. 8B shows a second schematic of a hybrid droplet generator nozzle 820, according to some embodiments. In some embodiments, hybrid droplet generator nozzle 820 may represent an exemplary embodiment of hybrid droplet generator nozzle 800, shown in FIG. 8A. In some embodiments, hybrid droplet generator nozzle 820 may be referred to herein as nozzle 820 or droplet generator nozzle 820 for simplicity. Droplet generator nozzle 820 may comprise metal body 822, metal fitting 823, capillary 824, membrane 826, seal centering ring 827, electromechanical element 828, throttle 829, pump chamber 840, molybdenum tube 841, tantalum ring 842, polyimide ring 843, pre-tension wedges 845, and pin 839.

In some embodiments, metal body 822, metal fitting 823, capillary 824, membrane 826, pump chamber 840, and electromechanical element 828 may represent exemplary embodiments of metal body 802, metal fitting 812, capillary 804, membrane 814, pump chamber 815, and electromechanical element 808, respectively of droplet generator nozzle 800 shown in FIG. 8A.

In some embodiments, droplet generator nozzle 820 in FIG. 8B may differ from droplet generator nozzle 800 in FIG. 8A, in that a gasket is disposed between the metal body 822 and the metal fitting 823. In some embodiments, the gasket may be formed by tantalum ring 842 and polyimide ring 843, which may be two concentric rings. In some embodiments, the gasket may be included in droplet generator nozzle 820 to improve reliability of the seal provided by the metal fitting 823 and reduce stress on the metal body 822 and the metal fitting 823. In some embodiments, gasket may be referred to herein as seal. In some embodiments, the gasket may have a thickness between about 0.1 mm and 2 mm, and can be made out of polyimide, tantalum or a combination thereof. Other dimensions and other suitable materials may be used in other embodiments. In some embodiments, two gaskets 842, 843 may be used in droplet generator nozzle 820 and arranged at both ends of the metal body 822. In some embodiments, seal centering ring 827 may comprise an extra metal ring around gasket which is used to center the seal.

In some embodiments, throttle 829 may be arranged in metal body 822 between a first gasket and a second gasket that is arranged adjacent to metal fitting 823. Throttle 829 may be used to control the flow and transfer of material used for droplet generation (e.g., liquid Sn) to capillary 824. In some embodiments, fluid (e.g., liquid Sn) may flow from a cylindrical or tubular portion of the droplet generator nozzle 820 (e.g., a W filter), through throttle 829 into metal body 822, and out capillary 824. Droplet generator nozzle 820 may include a W (tungsten) filter. The W (wolfram a.k.a.

Tungsten) filter may be molybdenum tube 841 with fittings on both ends. Inside the molybdenum tube 841 is a porous tungsten filter element welded into it, but other Sn compatible materials may also be used in place of tungsten. The function of the W filter is to stop any particle bigger than a certain size from migrating towards the orifice. In some embodiments, particles can cause clogging or damage to the orifice.

Throttle 829 may also be used to isolate capillary 824 and pump chamber acoustics from the W filter of the droplet generator nozzle 820. In some embodiments, the use of throttle 829 in droplet generator nozzle 820 allows the generation of high pressure fluctuations in the pump chamber 840 of the droplet generator nozzle 820.

FIG. 8C shows a third schematic of a hybrid droplet generator nozzle 830, according to some embodiments. In some embodiments, hybrid droplet generator nozzle 830 may represent an exemplary embodiment of hybrid droplet generator nozzle 800 and 820, shown in FIGS. 8A and 8B, respectively.

In some embodiments, hybrid droplet generator nozzle 830 may be referred to herein as nozzle 830 or droplet generator nozzle 830 for simplicity. Droplet generator nozzle 830 may comprise metal fitting 823, capillary 834, opening 831, membrane 836, seal centering ring 837, electromechanical element 838, pin 839, pump chamber 840, molybdenum tube 841, tantalum ring 842, polyimide ring 843, and pre-tension wedges 845.

In some embodiments, droplet generator nozzle 830 of FIG. 8C represents the embodiment shown in FIG. 8B, in a cross section orthogonal to the cross section shown in FIG. 8B. . In some embodiments, droplet generator nozzle 830 opening 831 which comprises one or more holes or openings in modular body of nozzle 830 for any wiring connected to the electromechanical element 838. Droplet generator nozzle 830 also includes pin 839 for securing components (e.g., electromechanical element 838 and gasket formed by tantalum ring 842 and polyimide ring 843) of the droplet generator nozzle 830 together. In some embodiments, electromechanical element 838 may deform membrane 836 via pin 839 that is in mechanical contact with electromechanical element 838 and membrane 836. In some embodiments, actuation energy resulting from electromechanical element 838 is transferred to pump chamber 840 and membrane 836 via pin 839 and then to the fluid (e.g., liquid Sn). In some embodiments, the displacement of the electromechanical element 838 is transferred to the membrane 836 in the form of acoustical waves. In some embodiments, an adhesive may be used to minimize losses in the transfer of the acoustic waves between different parts.

Exemplary Methods of Operation

Figure 9:
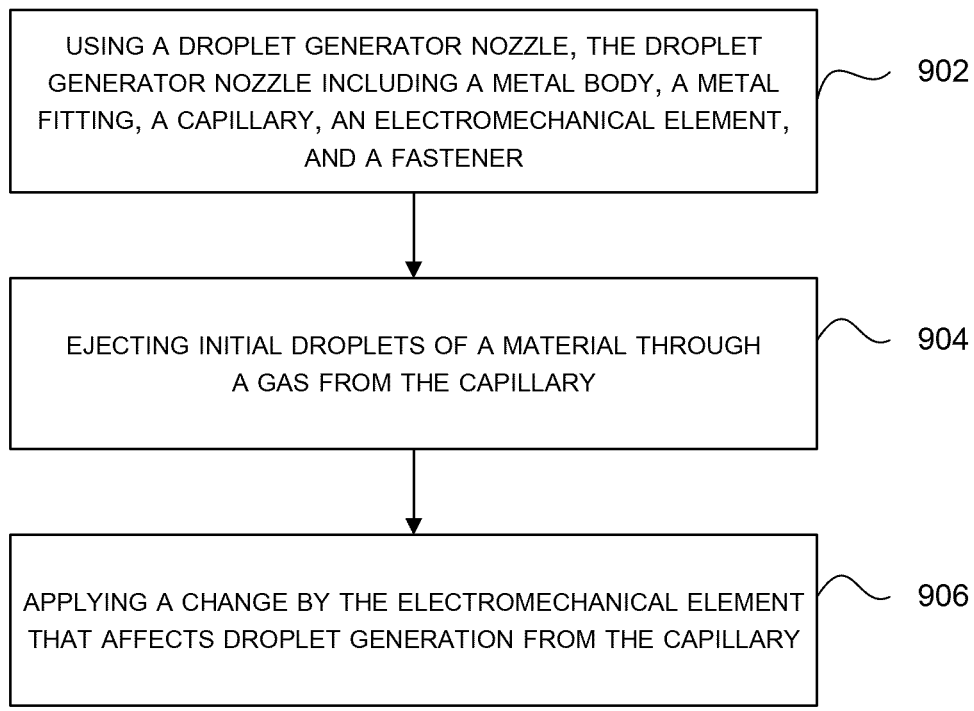
FIG. 9 a schematic illustration of a flowchart for generating droplets using a hybrid droplet generator nozzle, according to some embodiments.

FIG. 9 is a flowchart of an exemplary method 900 for generating droplets using a droplet generator nozzle, according to some embodiments. In some embodiments, method 900 may describe the operation of a droplet generator nozzle, such as droplet generator nozzle 800 as discussed above with reference to FIGS. 8A and 8B. It should be understood that the operations shown in method 900 are not exhaustive and that other operations can be performed as well before, after, or between any of the illustrated operations. In various embodiments of the present disclosure, the operations of method 900 can be performed in a different order and/or vary.

In operation 902, a droplet generator nozzle may be used. The droplet generator nozzle includes a metal body, a metal fitting arranged adjacent to the metal body, a capillary, an electromechanical element, and a fastener element. The capillary has a first end and a second end. The first end of the capillary is arranged within the metal fitting. The electromechanical element is disposed within the metal body and coupled to the first end of the capillary. The fastener element is configured to clamp around a portion of the metal body and around the metal fitting.

In operation 904, initial droplets of a material may be ejected by the capillary through a gas. The droplets may be ejected from the second end of the capillary, which protrudes out from an opening in the fastener element.

In operation 906, a change may be applied by the electromechanical element that affects droplet generation from the capillary, although it may be alternatively stated that the change applied by the electromechanical element results in droplet generation from the capillary. In some embodiments, the change applied by the electromechanical element facilitates the production of periodic droplets of identical size and velocity. The frequency at which these droplets are formed may be equal to the frequency at which the electromechanical element is actuated. The droplets are generated to arrive at the location where they will be used as a fuel for plasma production. In some embodiments, this location may be referred to as "primary focus." In some embodiments, the change applied by the electromechanical element may enable the droplets to arrive at the primary focus with an acceptable variation in droplet-spacing. An unacceptable droplet spacing variation may result in sub-optimal conversion efficiency of the EUV source and potentially debris generation. In some embodiments, the change applied by the electromechanical element may prevent the production of so-called "satellite droplets", which would be small droplets that are not coalesced with the main droplets. In some embodiments, these satellite droplets may cause unintended EUV, which could affect the die yield in the scanner.

Although specific reference can be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, LCDs, thin-film magnetic heads, etc. The skilled artisan will appreciate that, in the context of such alternative applications, any use of the terms "wafer" or "die" herein can be considered as synonymous with the more general terms "substrate" or "target portion", respectively. The substrate referred to herein can be processed, before or after exposure, in for example a track unit (a tool that typically applies a layer of resist to a substrate and develops the exposed resist), a metrology unit and/or an inspection unit. Where applicable, the disclosure herein can be applied to such and other substrate processing tools. Further, the substrate can be processed more than once, for example in order to create a multi-layer IC, so that the term substrate used herein may also refer to a substrate that already contains multiple processed layers.

It is to be understood that the phraseology or terminology herein is for the purpose of description and not of limitation, such that the terminology or phraseology of the present disclosure is to be interpreted by those skilled in relevant art(s) in light of the teachings herein.

The terms "radiation," "beam," "light," "illumination," and the like as used herein may encompass all types of electromagnetic radiation, for example, ultraviolet (UV) radiation (for example, having a wavelength $\lambda$ of 365, 248, 193, 157 or 126 nm), extreme ultraviolet (EUV or soft X-ray) radiation (for example, having a wavelength in the range of 5-100 nm such as, for example, 13.5 nm), or hard X-ray working at less than 5 nm, as well as particle beams, such as ion beams or electron beams. Generally, radiation having wavelengths between about 400 to about 700 nm is considered visible radiation; radiation having wavelengths between about 780-3000 nm (or larger) is considered IR radiation. UV refers to radiation with wavelengths of approximately 100-400 nm. Within lithography, the term "UV" also applies to the wavelengths that can be produced by a mercury discharge lamp: C-line 436 nm; H-line 405 nm; and/or, I-line 365 nm. Vacuum UV, or VUV (i.e., UV absorbed by gas), refers to radiation having a wavelength of approximately 100-200 nm. Deep UV (DUV) generally refers to radiation having wavelengths ranging from 126 nm to 428 nm, and in some embodiments, an excimer laser can generate DUV radiation used within a lithographic apparatus. It should be appreciated that radiation having a wavelength in the range of, for example, 5-20 nm relates to radiation with a certain wavelength band, of which at least part is in the range of 5-20 nm.

The term "substrate" as used herein describes a material onto which material layers are added. In some embodiments, the substrate itself can be patterned and materials added on top of it may also be patterned, or may remain without patterning.

While specific embodiments of the present disclosure have been described above, it will be appreciated that the present disclosure can be practiced otherwise than as described. The description is not intended to limit the present disclosure.

It is to be appreciated that the Detailed Description section, is intended to be used to interpret the claims. The Summary and Abstract sections may set forth one or more but not all exemplary embodiments of the present disclosure as contemplated by the inventor(s), and thus, are not intended to limit the present disclosure and the appended claims in any way.

The present disclosure has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein.

Other aspects of the invention are set out in the following numbered clauses.

1. A droplet generator nozzle comprising:
a metal body;
a metal fitting arranged adjacent to the metal body;
a capillary comprising a first end and a second end, the first end of the capillary disposed within the metal fitting, wherein the capillary is configured to eject initial droplets of a material from the second end of the capillary;
an electromechanical element disposed within the metal body and coupled to the first end of the capillary, wherein the electromechanical element is configured to apply a change that affects droplet generation from the capillary; and
a fastener element configured to clamp around a portion of the metal body and around the metal fitting, with the second end of the capillary protruding out from an opening in the fastener element.

2. The droplet generator nozzle of clause 1, further comprising a gasket arranged between the metal body and the metal fitting, wherein the metal fitting provides a seal around the first end of the capillary and reduces vibrations of the capillary.

3. The droplet generator nozzle of clause 1, further comprising:
a pump chamber and a membrane arranged at an interface between the metal body and the first end of the capillary within the metal fitting, wherein the membrane is configured to separate the material used for the droplet generation from the electromechanical element.

4. The droplet generator nozzle of clause 1, wherein the change applied by the electromechanical element causes a change in a volume of the material used for the droplet generation.

5. The droplet generator nozzle of clause 1, wherein the change applied by the electromechanical element causes a change in pressure of the material used for the droplet generation.

6. The droplet generator nozzle of clause 1, wherein the electromechanical element comprises a piezoelectric material.

7. The droplet generator nozzle of clause 1, wherein the electromechanical element is modular.

8. A lithographic apparatus comprising:
an illumination system configured to illuminate a pattern of a patterning device, the illumination system comprising:
a droplet generator nozzle comprising:
a metal body;
a metal fitting arranged adjacent to the metal body;
a capillary comprising a first end and a second end, the first end of the capillary disposed within the metal fitting, wherein the capillary is configured to eject initial droplets of a material from the second end of the capillary;
an electromechanical element disposed within the metal body and coupled to the first end of the capillary, wherein the electromechanical element is configured to apply a change that affects droplet generation from the capillary; and
a fastener element configured to clamp around a portion of the metal body and around the metal fitting, with a second end of the capillary protruding through an opening in the fastener element,
wherein the illumination system is further configured to generate EUV radiation using the droplet generator nozzle; and
a projection system configured to project an image of the pattern on to a target portion of a substrate.

9. The lithographic apparatus of clause 8, wherein the illumination system is further configured to illuminate the pattern of the patterning device using the EUV radiation.

10. The lithographic apparatus of clause 8, further comprising a gasket arranged between the metal body and the metal fitting, wherein the metal fitting provides a seal around the first end of the capillary and reduces vibrations of the capillary.

11. The lithographic apparatus of clause 8, wherein the droplet generator further comprises: a pump chamber and a membrane arranged at an interface between the metal body and the first end of the capillary within the metal fitting, wherein the membrane is configured to separate the material used for the droplet generation from the electromechanical element.

12. The lithographic apparatus of clause 8, wherein the change applied by the electromechanical element causes a change in a volume of the material used for the droplet generation.

13. The lithographic apparatus of clause 8, wherein the change applied by the electromechanical element causes a change in pressure of the material used for the droplet generation 14. The lithographic apparatus of clause 8, wherein the electromechanical element comprises a piezoelectric material.

15. The lithographic apparatus of clause 8, wherein the electromechanical element is modular.

16. A method comprising:
using a droplet generator nozzle, the droplet generator nozzle comprising: a metal body, a metal fitting arranged adjacent to the metal body, a capillary comprising a first end and a second end, the first end of the capillary disposed within the metal fitting, an electromechanical element disposed within the metal body and coupled to the first end of the capillary, and a fastener element configured to clamp around a portion of the metal body and around the metal fitting, with the second end of the capillary protruding out from an opening in the fastener element; ejecting initial droplets of a material from the second end of the capillary; and applying a change by the electromechanical element that affects droplet generation from the capillary.

17. The method of clause 16, further comprising:
reducing vibrations of the capillary by using the metal fitting to provide a seal around the first end of the capillary.

18. The method of clause 16, further comprising:
separating the material used for the droplet generation from the electromechanical element by using a membrane arranged at an interface between the metal body and the first end of the capillary within the metal fitting.

19. The method of clause 16, wherein the change applied by the electromechanical element causes a change in a volume of the material used for the droplet generation.

20. The method of clause 16, wherein the change applied by the electromechanical element causes a change in pressure of the material used for the droplet generation.

21. The method of clause 16, wherein the ejecting initial droplets comprises ejecting initial droplets of a material through a gas from the second end of the capillary generation.

The breadth and scope of protected subject matter should not be limited by any of the above-described exemplary embodiments, but should be defined only in accordance with the following claims and their equivalents.

The invention claimed is:

1. A droplet generator nozzle comprising:
a metal body;
a metal fitting arranged adjacent to the metal body;
a capillary comprising a first end and a second end, the first end of the capillary disposed within the metal fitting, wherein the capillary is configured to eject initial droplets of a material from the second end of the capillary;
an electromechanical element disposed within the metal body and coupled to the first end of the capillary, wherein the electromechanical element is configured to apply a change that affects droplet generation from the capillary; and
a fastener element configured to clamp around a portion of the metal body and around the metal fitting, with the second end of the capillary protruding out from an opening in the fastener element.

2. The droplet generator nozzle of claim 1, further comprising a gasket arranged between the metal body and the metal fitting, wherein the metal fitting provides a seal around the first end of the capillary and reduces vibrations of the capillary.

3. The droplet generator nozzle of claim 1, further comprising:
a pump chamber and a membrane arranged at an interface between the metal body and the first end of the capillary within the metal fitting, wherein the membrane is configured to separate the material used for the droplet generation from the electromechanical element.

4. The droplet generator nozzle of claim 1, wherein the change applied by the electromechanical element causes a change in a volume of the material used for the droplet generation.

5. The droplet generator nozzle of claim 1, wherein the change applied by the electromechanical element causes a change in pressure of the material used for the droplet generation.

6. The droplet generator nozzle of claim 1, wherein the electromechanical element comprises a piezoelectric material.

7. The droplet generator nozzle of claim 1, wherein the electromechanical element is modular.

8. A lithographic apparatus comprising:
an illumination system configured to illuminate a pattern of a patterning device, the illumination system comprising:
a droplet generator nozzle comprising:
a metal body;
a metal fitting arranged adjacent to the metal body;
a capillary comprising a first end and a second end, the first end of the capillary disposed within the metal fitting, wherein the capillary is configured to eject initial droplets of a material from the second end of the capillary;
an electromechanical element disposed within the metal body and coupled to the first end of the capillary, wherein the electromechanical element is configured to apply a change that affects droplet generation from the capillary; and
a fastener element configured to clamp around a portion of the metal body and around the metal fitting, with a second end of the capillary protruding through an opening in the fastener element,
wherein the illumination system is further configured to generate EUV radiation using the droplet generator nozzle; and
a projection system configured to project an image of the pattern on to a target portion of a substrate.

9. The lithographic apparatus of claim 8, wherein the illumination system is further configured to illuminate the pattern of the patterning device using the EUV radiation.

10. The lithographic apparatus of claim 8, further comprising a gasket arranged between the metal body and the metal fitting, wherein the metal fitting provides a seal around the first end of the capillary and reduces vibrations of the capillary.

11. The lithographic apparatus of claim 8, wherein the droplet generator further comprises: a pump chamber and a membrane arranged at an interface between the metal body and the first end of the capillary within the metal fitting, wherein the membrane is configured to separate the material used for the droplet generation from the electromechanical element.

12. The lithographic apparatus of claim 8, wherein the change applied by the electromechanical element causes a change in a volume of the material used for the droplet generation.

13. The lithographic apparatus of claim 8, wherein the change applied by the electromechanical element causes a change in pressure of the material used for the droplet generation.

14. The lithographic apparatus of claim 8, wherein the electromechanical element comprises a piezoelectric material.

15. The lithographic apparatus of claim 8, wherein the electromechanical element is modular.

16. A method comprising:
using a droplet generator nozzle, the droplet generator nozzle comprising: a metal body, a metal fitting arranged adjacent to the metal body, a capillary comprising a first end and a second end, the first end of the capillary disposed within the metal fitting, an electromechanical element disposed within the metal body and coupled to the first end of the capillary, and a fastener element configured to clamp around a portion of the metal body and around the metal fitting, with the second end of the capillary protruding out from an opening in the fastener element;
ejecting initial droplets of a material from the second end of the capillary; and
applying a change by the electromechanical element that affects droplet generation from the capillary.

17. The method of claim 16, further comprising:
reducing vibrations of the capillary by using the metal fitting to provide a seal around the first end of the capillary.

18. The method of claim 16, further comprising:
separating the material used for the droplet generation from the electromechanical element by using a membrane arranged at an interface between the metal body and the first end of the capillary within the metal fitting.

19. The method of claim 16, wherein the change applied by the electromechanical element causes a change in a volume of the material used for the droplet generation.

20. The method of claim 16, wherein the change applied by the electromechanical element causes a change in pressure of the material used for the droplet generation.

21. The method of claim 16, wherein the ejecting initial droplets comprises ejecting initial droplets of a material through a gas from the second end of the capillary generation.

* * * * *